(12) United States Patent
Balteanu et al.

(10) Patent No.: US 10,749,512 B2
(45) Date of Patent: Aug. 18, 2020

(54) SWITCH CONTROL CIRCUITRY

(71) Applicant: SKYWORKS SOLUTIONS, INC., Woburn, MA (US)

(72) Inventors: Florinel G. Balteanu, Irvine, CA (US); Paul T. Dicarlo, Marlborough, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 16/596,692

(22) Filed: Oct. 8, 2019

(65) Prior Publication Data

US 2020/0112300 A1 Apr. 9, 2020

Related U.S. Application Data

(60) Provisional application No. 62/742,483, filed on Oct. 8, 2018.

(51) Int. Cl.
| | |
|---|---|
| *H04B 1/40* | (2015.01) |
| *H03K 3/356* | (2006.01) |
| *H03K 17/687* | (2006.01) |
| *H01L 23/66* | (2006.01) |
| *H04B 1/44* | (2006.01) |
| *H03K 19/0185* | (2006.01) |
| *H02M 3/07* | (2006.01) |

(52) U.S. Cl.
CPC ........ *H03K 3/356113* (2013.01); *H01L 23/66* (2013.01); *H03K 17/6872* (2013.01); *H03K 19/018521* (2013.01); *H04B 1/44* (2013.01); *H01L 2223/6677* (2013.01); *H02M 3/07* (2013.01)

(58) Field of Classification Search
CPC .... H04B 1/38; H04B 1/40; H04B 1/44; H01L 27/1211; H01L 29/78; H01L 23/66; H03K 3/356113; H03K 17/6872; H03K 19/018521
See application file for complete search history.

(56) References Cited

U.S. PATENT DOCUMENTS

| | | | |
|---|---|---|---|
| 2013/0115895 A1* | 5/2013 | Crandall ................... | H04B 1/38 455/73 |
| 2015/0194979 A1* | 7/2015 | Jiang ................... | H04M 1/0202 455/550.1 |
| 2016/0043710 A1* | 2/2016 | Crandall ................ | H03K 17/04 327/374 |
| 2016/0111954 A1* | 4/2016 | Bach ........................ | H04R 3/00 381/113 |
| 2018/0234095 A1* | 8/2018 | Balteanu ........... | H03K 3/356113 |

* cited by examiner

*Primary Examiner* — Thanh C Le
(74) *Attorney, Agent, or Firm* — Chang & Hale LLP

(57) ABSTRACT

Disclosed herein are silicon-on-insulator (SOI) switches and associated control circuits having level shifters configured to provide increased voltages (positive and/or negative) to the switches. The disclosed level shifters can be configured to provide increased voltages and can be used with high-linearity switches and/or can improve the linearity of switches. The improved switch performance can improve front end module performance for applications such as carrier aggregation (CA) and multiple input multiple output (MIMO) as well as with protocols such as Long-Term Evolution Advanced (or LTE-A).

20 Claims, 15 Drawing Sheets

SWITCH CONTROL CIRCUITRY

CROSS-REFERENCE TO RELATED APPLICATION(S)

This application claims priority to U.S. Prov. App. No. 62/742,483 filed Oct. 8, 2018 and entitled "SWITCH CONTROL CIRCUITRY," which is expressly incorporated by reference herein in its entirety for all purposes.

BACKGROUND

Field

The present disclosure generally relates to radio-frequency switches and control circuits for RF switches.

Description of Related Art

Mobile devices utilize different strategies to increase data throughput. Examples include carrier aggregation (CA) and multiple input multiple output (MIMO) technologies. Carrier aggregation (CA) can be used for both Frequency Division Duplex (FDD) and Time Division Duplex (TDD). MIMO can be used to increase the overall bitrate by transmitting two (or more) different data streams on two (or more) different antennas. Other technologies such as licensed assisted access (LAA), massive CA, and massive MIMO can be employed to further increase network data speeds.

SUMMARY

According to a number of implementations, the present disclosure relates to a voltage level circuit. The voltage level circuit includes a first outer transistor stack including at least six transistors in series between a high voltage input port and a low voltage input port, with at least three series p-channel metal-oxide-semiconductor field effect (PMOS) transistors in series with at least three series n-channel metal-oxide-semiconductor field effect (NMOS) transistors. The voltage level circuit also includes a second outer transistor stack coupled in parallel with the first outer transistor stack between the high voltage input port and the low voltage input port, the second outer transistor stack including at least six transistors in series with at least three series PMOS transistors in series with at least three series NMOS transistors. The voltage level circuit also includes a first inner transistor stack coupled in parallel with the first outer transistor stack between the high voltage input port and the low voltage input port, the first inner transistor stack including at least four transistors in series with at least two series PMOS transistors in series with at least two series NMOS transistors. The voltage level circuit also includes a second inner transistor stack coupled in parallel with the second outer transistor stack between the high voltage input port and the low voltage input port, the second inner transistor stack including at least four transistors in series with at least two series PMOS transistors in series with at least two series NMOS transistors. The voltage level circuit also includes at least two inner PMOS transistors that are cross-coupled, a first inner PMOS transistor having its source coupled to a gate of a PMOS transistor of the first inner transistor stack and a second inner PMOS transistor having its source coupled to a gate of a PMOS transistor of the second inner transistor stack. The voltage level circuit also includes an input port configured to receive an input signal. The voltage level circuit also includes an output port configured to provide an output signal such that in response to receiving a high signal at the input port the output port provides a voltage approximately equal to a voltage provided at the high voltage input port and in response to receiving a low signal at the input port the output port provides a voltage approximately equal to a voltage provided at the low voltage input port.

In some embodiments, the circuit further includes a complementary input port configured to receive a complement of the input signal. In some embodiments, the output port is coupled between the three series PMOS transistors and the three series NMOS transistors of the first outer transistor stack.

In some embodiments, the circuit further includes a complementary output port configured to provide a second output signal. In further embodiments, in response to receiving a high signal at the input port the complementary output port provides a voltage approximately equal to a voltage provided at the low voltage input port and in response to receiving a low signal at the input port the complementary output port provides a voltage approximately equal to a voltage provided at the high voltage input port. In further embodiments, the complementary output port is coupled between the three series PMOS transistors and the three series NMOS transistors of the second outer transistor stack.

In some embodiments, a drain of an NMOS transistor coupled to the low voltage input port of the first inner transistor stack is coupled to a gate of an NMOS transistor coupled to the low voltage input port of the first outer transistor stack. In further embodiments, a drain of an NMOS transistor coupled to the low voltage input port of the second inner transistor stack is coupled to a gate of an NMOS transistor coupled to the low voltage input port of the second outer transistor stack.

In some embodiments, the circuit further includes a first bias input configured to receive a first bias signal, a second bias input configured to receive a second bias signal, and a third bias input configured to receive a third bias signal. In further embodiments, in the first outer transistor stack, a gate of a first PMOS transistor that has its source coupled to the high voltage input port receives a complement of the input signal, a gate of a second PMOS transistor that has its source coupled to a drain of the first PMOS transistor receives the first bias signal, a gate of a third PMOS transistor that has its source coupled to a drain of the second PMOS transistor receives the second bias signal, a gate of a first NMOS transistor that has its drain coupled to a drain of the third PMOS transistor receives the second bias signal, and a gate of a second NMOS transistor that has its drain coupled to a source of the first NMOS transistor receives the third bias signal. In yet further embodiments, in the first inner transistor stack, a gate of a first PMOS transistor that has its source coupled to the high voltage input port receives the input signal, a gate of a second PMOS transistor that has its source coupled to a drain of the first PMOS transistor receives the first bias signal, a gate of a first NMOS transistor that has its drain coupled to a drain of the second PMOS transistor receives the second bias signal.

In some embodiments, the circuit further includes one or more diodes coupled between two of the NMOS series transistors of the first inner transistor stack.

In some embodiments, a switch control circuit includes one or more of the above voltage level circuits wherein the switch control circuit is configured to generate a negative voltage of at least −4 V.

According to a number of implementations, the present disclosure relates to a radio-frequency (RF) module. The RF module includes a packaging substrate configured to receive a plurality of components. The RF module also includes a switching circuit implemented on the packaging substrate, the switching circuit including a voltage level shifter having first outer transistor stack including at least six transistors in series between a high voltage input port and a low voltage input port, with at least three series p-channel metal-oxide-semiconductor field effect (PMOS) transistors in series with at least three series n-channel metal-oxide-semiconductor field effect (NMOS) transistors, the switching circuit further including a second outer transistor stack coupled in parallel with the first outer transistor stack between the high voltage input port and the low voltage input port, the second outer transistor stack including at least six transistors in series with at least three series PMOS transistors in series with at least three series NMOS transistors, the voltage level shifter further including a first inner transistor stack coupled in parallel with the first outer transistor stack between the high voltage input port and the low voltage input port, the first inner transistor stack including at least four transistors in series with at least two series PMOS transistors in series with at least two series NMOS transistors, the voltage level shifter further including a second inner transistor stack coupled in parallel with the second outer transistor stack between the high voltage input port and the low voltage input port, the second inner transistor stack including at least four transistors in series with at least two series PMOS transistors in series with at least two series NMOS transistors, the voltage level shifter further including at least two inner PMOS transistors that are cross-coupled, a first inner PMOS transistor having its source coupled to a gate of a PMOS transistor of the first inner transistor stack and a second inner PMOS transistor having its source coupled to a gate of a PMOS transistor of the second inner transistor stack, the voltage level shifter further including an input port configured to receive an input signal, the voltage level shifter further including an output port configured to provide an output signal such that in response to receiving a high signal at the input port the output port provides a voltage approximately equal to a voltage provided at the high voltage input port and in response to receiving a low signal at the input port the output port provides a voltage approximately equal to a voltage provided at the low voltage input port.

In some embodiments, the RF module is a front-end module. In some embodiments, the switching circuit further comprises a voltage generator to output a positive voltage provided to the high voltage input port and a negative voltage provided to the low voltage input port. In further embodiments, the switching circuit further includes a series arm configured to receive an RF signal and to output the RF signal in an on state, the series arm configured to receive the positive voltage through the voltage level shifter to put the series arm in the on state and to receive the negative voltage through the voltage level shifter to put the series arm in an off state. In yet further embodiments, the switching circuit is implemented on a single semiconductor die.

According to a number of implementations, the present disclosure relates to a wireless device. The wireless device includes a transceiver configured to generate a radio-frequency (RF) signal. The wireless device also includes a front-end module (FEM) in communication with the transceiver, the FEM including a packaging substrate configured to receive a plurality of components, the FEM further including a switching circuit implemented on the packaging substrate, the switching circuit including a voltage level shifter having first outer transistor stack including at least six transistors in series between a high voltage input port and a low voltage input port, with at least three series p-channel metal-oxide-semiconductor field effect (PMOS) transistors in series with at least three series n-channel metal-oxide-semiconductor field effect (NMOS) transistors, the switching circuit further including a second outer transistor stack coupled in parallel with the first outer transistor stack between the high voltage input port and the low voltage input port, the second outer transistor stack including at least six transistors in series with at least three series PMOS transistors in series with at least three series NMOS transistors, the voltage level shifter further including a first inner transistor stack coupled in parallel with the first outer transistor stack between the high voltage input port and the low voltage input port, the first inner transistor stack including at least four transistors in series with at least two series PMOS transistors in series with at least two series NMOS transistors, the voltage level shifter further including a second inner transistor stack coupled in parallel with the second outer transistor stack between the high voltage input port and the low voltage input port, the second inner transistor stack including at least four transistors in series with at least two series PMOS transistors in series with at least two series NMOS transistors, the voltage level shifter further including at least two inner PMOS transistors that are cross-coupled, a first inner PMOS transistor having its source coupled to a gate of a PMOS transistor of the first inner transistor stack and a second inner PMOS transistor having its source coupled to a gate of a PMOS transistor of the second inner transistor stack, the voltage level shifter further including an input port configured to receive an input signal, the voltage level shifter further including an output port configured to provide an output signal such that in response to receiving a high signal at the input port the output port provides a voltage approximately equal to a voltage provided at the high voltage input port and in response to receiving a low signal at the input port the output port provides a voltage approximately equal to a voltage provided at the low voltage input port. The wireless device also includes an antenna in communication with the FEM, the antenna configured to transmit the amplified RF signal.

In some embodiments, the switching circuit comprises a dual pole dual throw switch configured to swap the RF signal between the antenna and a diversity antenna.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

Figure 1:
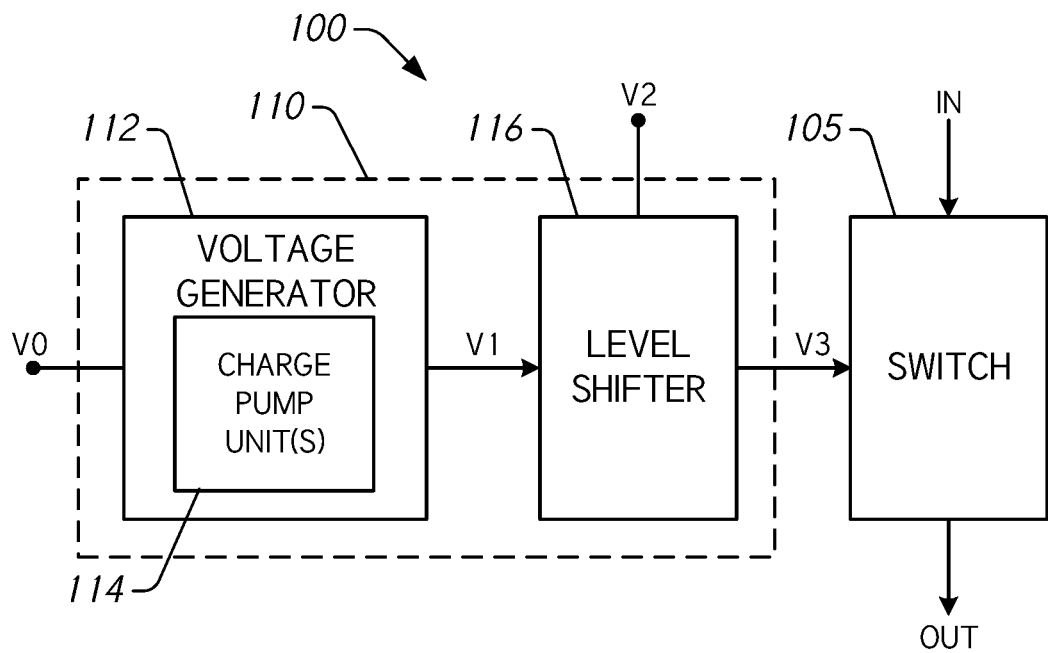
FIG. 1 illustrates a switch configuration having a switch that is controlled by control circuitry.

The headings provided herein, if any, are for convenience only and do not necessarily affect the scope or meaning of the claimed invention.

Overview

Increased use of mobile devices, such as smartphones and tablets, to browse internet content, stream video, and participate in social media motivates a corresponding increase in supporting more cellular bands, higher frequency bands, and lower emissions in uplink and downlink carrier aggregation (CA). One way to increase data throughput is to add more bandwidth through the aggregation of carriers. Carrier aggregation (CA) can be used for both Frequency Division Duplex (FDD) and Time Division Duplex (TDD). As an example, aggregated carriers can have a bandwidth of 1.4, 3, 5, 10, 15 or 20 MHz and five component carriers can be aggregated resulting in a bandwidth of up to 100 MHz. Multiple input, multiple output (MIMO) is another technology that can be used to increase the overall bitrate by transmitting two (or more) different data streams on two (or more) different antennas. Other technologies such as licensed assisted access (LAA), massive CA, and massive MIMO can be employed to further increase network data speeds. However, the potential gain in performance for a MIMO system may be mitigated by the increased cost of the number of radio-frequency (RF) hardware components.

To reduce the complexity of deploying MIMO technology, a complexity reduction technique known as antenna selection/swap can be applied. For example, as described herein, antenna swap may be achieved through a low-cost RF swap switch with a dual pole, dual throw (DPDT) configuration. The DPDT switch generally has higher linearity requirements than typical RF switches. Accordingly, it would be advantageous to provide RF switching architectures that provide targeted performance characteristics, such as targeted linearity, when employed in front end modules that utilize CA, MIMO, and other related technologies.

Moreover, technologies such as MIMO and CA generally require an increase in the number of switches in front end modules (FEMs) in mobile devices compared to other technologies. CMOS Silicon-on-insulator (SOI) technology is an advantageous technology for such switches and antenna tuners in mobile devices. SOI switching circuits utilize DC-to-DC power conversion techniques to efficiently utilize limited battery supply resources. Such circuits may require voltages that differ from a voltage provided by a battery. Accordingly, disclosed herein are SOI switches and associated control circuits having level shifters configured to provide increased voltages (positive and/or negative) to the switches. The disclosed level shifters can be configured to provide increased voltages and can be used with high-linearity switches and/or can improve the linearity of switches. The improved switch performance can improve front end module performance for applications such as CA and MIMO as well as with protocols such as Long-Term Evolution Advanced (or LTE-A).

In some instances, SOI switch technology is moving to architectures to provide high linearity for carrier aggregation applications. As a result, the SOI switches require the use of high value negative voltages (e.g., −2.5 V, −3.3 V, −3.5 V, −4 V) and/or high value positive voltages (e.g., 2.5 V, 3.3 V, 3.5 V, 4 V) to be applied. Previously, applications used discrete controllers with high voltage devices. However, the level shifters and associated level shift controls disclosed herein can be used to provide the required high value positive and/or negative voltages. The disclosed level shifters can be used with charge pumps that provide relatively large voltages (e.g., greater than about ±2.5 V, greater than about ±3.3 V, greater than about ±3.5 V, greater than about ±4 V, etc.).

The disclosed level shifters can advantageously provide voltage overstress protection for switching applications. For example, to overcome the stresses on the switches when applying larger voltage values, additional transistors can be added in series on the level shifter. Prior level shifters may have been able to achieve increases in voltage output but at a certain voltage level the transistors of the level shifter would begin to breakdown. To reduce the stress on the transistors for such high voltage applications, additional transistors can be included in the level shifter, as disclosed herein. To control such a configuration, additional complexity may be implemented in the level shifter control relative to previous level shifter configurations.

Disclosed herein are non-limiting examples of systems, devices, circuits, and/or methods related to reducing Ron in SOI switches to improve harmonics. For example, Ron can be reduced in these switches by increasing the positive voltage for the ON switch when a high signal at the switch is measured or detected.

The disclosed level shifters can be implemented in switching applications. For example, often there are integrated level shifters in an antenna switch module of a wireless device, which are used to shift provided supply voltages to higher values to control the field effect transistors (FETs) comprising the switches. This increase in voltage can result in improved linearity performance of the switches.

Examples of Switches, Control Circuits, and Level Shifters

FIG. 1 illustrates a switch configuration 100 having a switch 105 that is controlled by control circuitry 110. The control circuitry 110 can be directly connected to a voltage source (not shown), such as a battery, and is configured to provide a positive and negative voltage, V3, to selectively turn the switch 105 on and off. The switch 105 includes an input port that is configured to receive an input signal, such as a radio frequency (RF) signal, and an output port configured to provide an output signal when the switch is in the ON state. Example switches are described herein in greater detail with reference to FIGS. 9-12.

The control circuitry 110 includes a voltage generator 112 having one or more charge pump units 114, the voltage generator 112 configured to receive an input voltage, V0, such as a battery voltage, and to produce an output voltage, V1. In some embodiments, the one or more charge pump units 114 can be individually and selectively activated and de-activated to provide a desired or targeted output signal, V1.

The control circuitry 110 includes a level shifter 116 that has as inputs a voltage V2 and the voltage V1 from the voltage generator 112. The level shifter 116 can be configured to output different voltage values (e.g., V3) to the switch 105. For example, to turn the switch off, the level shifter 116 can output a negative voltage. To turn the switch on, the level shifter 116 can output a positive voltage. In some implementations, the level shifter 116 is configured to switch between providing a voltage V3 that is approximately equal to V1 in a first state and a voltage that is approximately equal to V2 in a second state. In certain implementations, the level shifter 116 is configured to provide two outputs with a first output approximately equal to V2 and a second output approximately equal to V1 in a first state, and the first output approximately equal to V1 and the second output approximately equal to V2 in a second state. In some embodiments, the voltages V1 and V2 can be provided by the same voltage generator, by different voltage generators, by a power supply or LDO and a voltage generator, or by two power supplies or LDOs. The level shifter 116 can include additional transistors in a core of the level shifter to control its operation and additional transistors configured to withstand larger swings in voltage. Example level shifters are described herein in greater detail, with a particular embodiment described with reference to FIG. 8.

Figure 2:
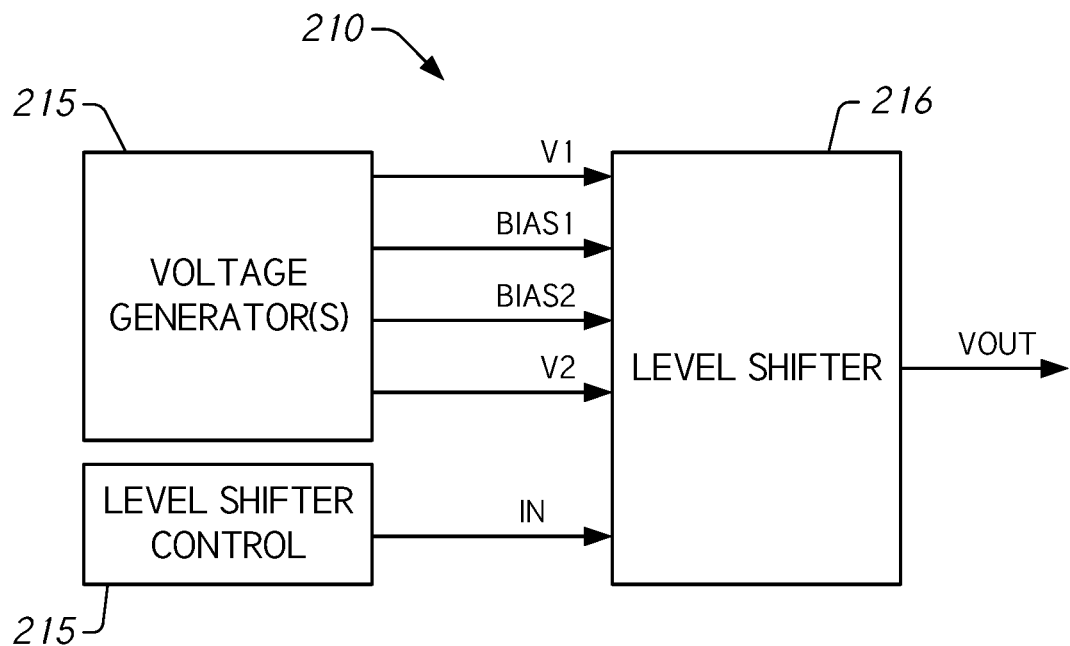
FIG. 2 illustrates a schematic block diagram of an example a switch controller.

FIG. 2 illustrates a schematic block diagram of an example a switch controller 210. The switch controller 210 includes one or more voltage generators 215, a level shifter 216 and a level shifter control circuit 215. The voltage generator is configured to provide a high and low voltage, V1 and V2, and bias voltages (BIAS1, BIAS2) between the high and low voltages. The level shifter control 215 is configured to provide a control signal, IN, to the level shifter 216 to control the value of the output voltage, VOUT. For example, when the control signal IN is on or high, the output voltage can be approximately equal to the high voltage V1 and when the control signal IN is low or off, the output voltage can be approximately equal to the low voltage V2. The output voltage VOUT can be used to turn on or off an RF switch. In certain configurations, the level shifter 216 generates two or more output voltages, with one approximately equal to V1 and the other approximately equal to V2. In such configurations, the control signal IN from the level shifter control 215 can control which output provides which output voltage. For example, in certain configurations, the level shifter 216 outputs a high positive voltage to control a series RF switch and a large negative voltage to control a shunt RF switch. However, other configurations are possible.

The level shifter 216 includes a plurality of transistors, as described herein, including n-channel metal-oxide-semiconductor field effect transistors (NMOS) transistors and p-channel metal-oxide-semiconductor field effect transistors (PMOS) transistors. In certain configurations, NMOS transistors are stacked in series with PMOS transistors to form an output stack with control transistor stacks that control whether the output stack provides a positive or high output voltage or a negative or low output voltage.

Although FIG. 2 illustrates a configuration in which the switch controller 210 includes one level shifter, the switch controller 210 can be adapted to included additional level shifters. In such configurations, a level shifter control circuit can be shared by all or part of the level shifters.

Figure 3:
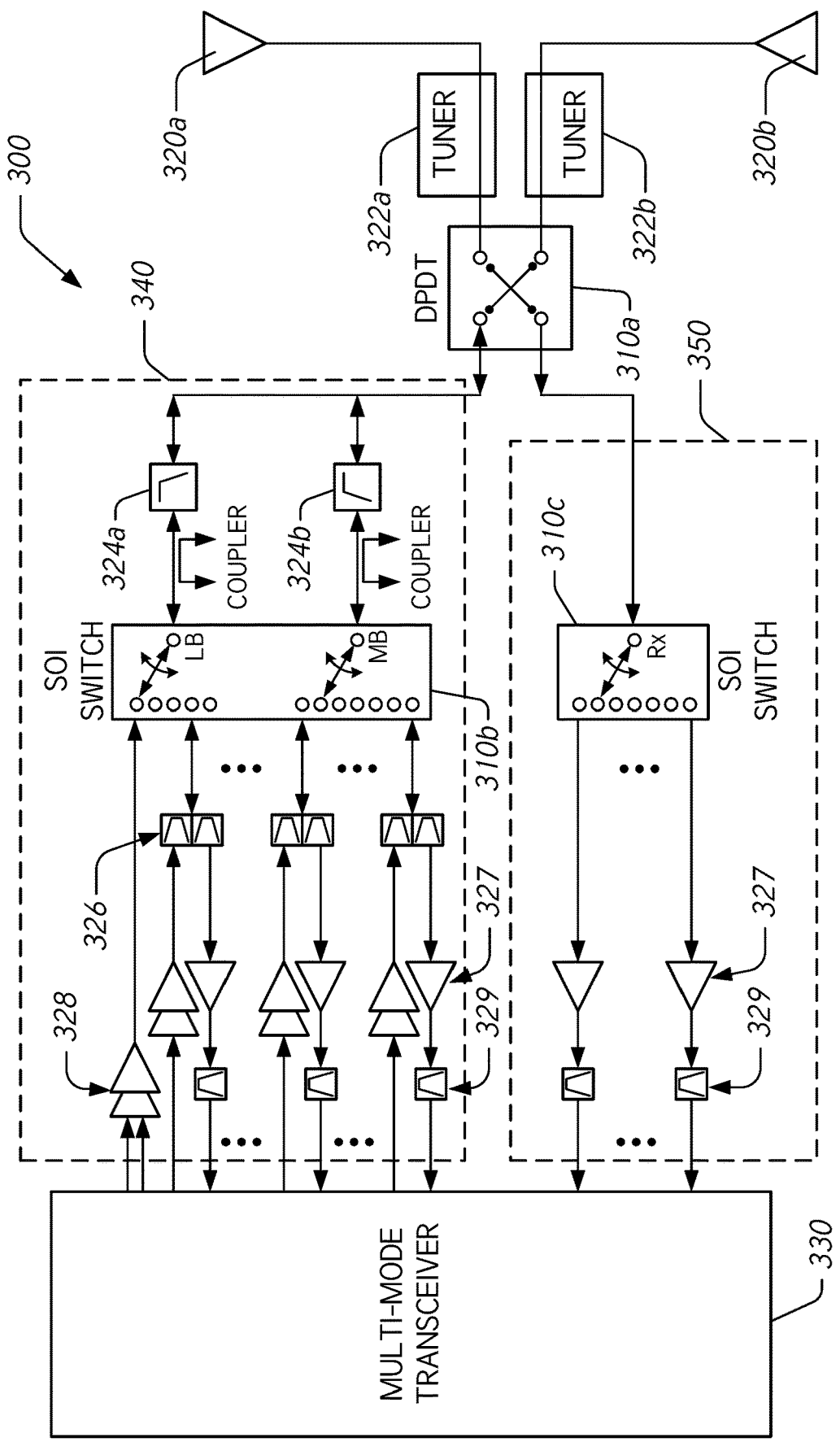
FIG. 3 illustrates a schematic diagram showing some radio front-end components of a wireless device with RF switches, wherein one or more of the RF switches includes control circuitry having one or more embodiments of the level shifters disclosed herein.

As described herein, the RF (radio frequency) switch is one of the many components that facilitate operation of a wireless device on multiple frequency bands. To that end, RF switches in various forms are often utilized throughout the radio front-end of a wireless device. By way of example, FIG. 3 illustrates a schematic diagram showing some radio front-end components of a wireless device 300 with RF switches 310a, 310b, 310c, wherein one or more of the RF switches 310a, 310b, 310c includes control circuitry having one or more embodiments of the level shifters disclosed herein. Those skilled in the art will appreciate that a wireless device may include fewer, more and/or different components than are illustrated in FIG. 3, and that FIG. 3 merely includes some example components to facilitate the discussion of aspects of example implementations disclosed herein.

The portion of the device 300 illustrated in FIG. 3 includes a multi-mode transceiver 330, a front-end module (FEM) 340, and a diversity receive FEM 350. In a wireless system, a front-end module (FEM) acts as an interface between the antenna and RF transceiver. In addition, the device 300 includes SOI switches with integrated SOI control circuitry (examples of which are described herein): antenna swap switch 310a, FEM switch 310b, and diversity FEM switch 310c. The device also includes antennas 320a and 320b, tuners 322a and 322b, diplexers 324a and 324b, duplexers 326, amplifiers 327 and 328, and filters 329.

The multi-mode transceiver 330 is coupled to the FEM 340 and the diversity FEM 350. For the sake of simplifying the description herein, the multi-mode transceiver 330 includes what those skilled in the art would consider the radio back-end or baseband and intermediate frequency (IF) components. Baseband and IF components typically implement functions such as, but not limited to, voice-to-data encoding, packet forming and framing of data, forward error correction, pulse shaping, etc. Those skilled in the art will appreciate from the present description that various baseband and IF functions are often implemented in various wireless devices, and that a more detailed description of those functions has been omitted for the sake of brevity.

The antenna swap switch 310a selectively couples the antennas 320a, 320b to the FEM 340 and/or the diversity FEM 350. The antenna swap switch 310a is a dual pole dual throw (DPDT) switch. The antenna swap switch 310a can be a high-linearity swap switch with control circuitry that contributes to improved performance, as described herein. For example, the control circuitry can include level shifters that can provide increased voltage values to the connected switches. The antenna swap switch 310a can be part of a complexity reduction technique for MIMO systems, for example. This can reduce the number of relatively expensive RF hardware components typically used when deploying MIMO technology in a wireless device. The antenna swap switch 310a selectively couples RF signals between the FEM 340 and either of the antennas 320a, 320b. Similarly, the antenna swap switch 310a selectively couples RF signals between the diversity FEM 350 and either of the antennas 320a, 320b.

The FEM 340 and diversity FEM 350 are multi-band FEMs. To that end, for example and without limitation, the FEM 340 and/or diversity FEM 350 can include modules for EDGE/EGPRS (Enhanced Data Rate GSM Evolution/Enhanced General Packet Radio Service), CDMA (e.g., 1×RTT, Evolution-Data Optimized CDMA (EV-DO)), UMTS-TDD (Universal Mobile Telecommunications System-Time Division Duplex), LTE-Advanced, and the like. The corresponding amplifiers 327 provide respective receiver-side amplifiers (e.g., low-noise amplifiers or LNAs). The corresponding amplifiers 328 provide respective transmitter-side amplifiers (e.g., power amplifiers or PAs).

The device 300 is designed for operation on multiple frequency bands. This can be used in CA configurations and MIMO configurations, for example and without limitation. The device 300 includes diplexers 324a, 324b respectively configured to direct low-band (LB) signals and mid-band (MB) signals to the FEM switch 310b. Transmit signals can be routed from the multi-mode transceiver 330 through amplifiers 328 to duplexers 326 and through switches 310b and 310a to a particular antenna 320a, 320b. Similarly, receive signals can be routed from a particular antenna 320a, 320b through switches 310a, 310b and duplexers 326 to amplifiers 327 and filters 329 to the multi-mode transceiver 330.

In some embodiments, signals received at the antennas 320a, 320b can be directed along a diversity receive path through the diversity FEM 350 having the diversity FEM switch 310c to the multi-mode transceiver 330. The diversity FEM 350 includes parallel amplifiers 327 (e.g., LNAs) that can be configured to provide multiple-output spatial diversity processing by the wireless device 300. Diversity techniques can be used to increase data rates and resilience against adverse channel conditions. For complexity, cost, and power considerations, diversity techniques can be applied exclusively on the receiver side of a mobile wireless device. In some embodiments, the power-handling requirements for the diversity FEM switch 310c can be less than the requirements for the FEM switch 310b due at least in part to spatial diversity techniques not being used when received signals have relatively high RF power.

While the aforementioned configurations of RF switches are illustrated in FIG. 3, those skilled in the art will appreciate that there are numerous configurations for RF switches that may be employed within a wireless device. For example, RF switch configurations in smart phones range from relatively simple, single-pole, single-throw (SPST) or single-pole, double-throw (SPDT) configurations through to more complex single-pole, n-throw (SPNT) configurations, double-pole, single-throw configurations (DPST), m-pole, single-throw configurations (MPST), double-pole, double-throw configurations (DPDT), and can sometimes include m-pole, n-throw configurations (MPNT).

As described in greater detail herein, each of the switches 310a, 310b, 310c can include integrated control circuitry with level shifters that provide relatively high voltages to the switches to improve performance (e.g., linearity). Multi-port antenna switches can be important building blocks in RF front-ends for cellular applications. With increased band utilization and standard implementation in wireless devices, both the complexity of control schemes and targeted multi-port antenna switch performances increase. Typically, GaAs pHEMT has been a dominant technology for RF antenna switch implementation. However, GaAs pHEMT antenna switches generally require a separate CMOS controller die for a logic and a charge pump circuit because a relatively high voltage is needed to control GaAs pHEMT switches. Accordingly, the disclosed level shifters, voltage generators, and control circuitry can be integrated on SOI CMOS switches to improve RF switch performance. Such implementations of SOI switches can provide desirable RF switch performance with integrated controllers, leading to a relatively compact, low-cost, low-power switch with high linearity.

As described in further detail herein, the switches 310a, 310b, and/or 310c can include integrated controllers that are configured to enable targeted RF isolation between the throws of the switch, targeted linearity, and/or targeted reduction of noise. For example, integrated level shifters in the antenna switch controller can be used to adjust the voltages supplied to the field-effect transistors (FETs) included in the switch. The level shifters can improve switch insertion loss and isolation, enhance the robustness of the compression point, and/or improve linearity.

Figure 4:
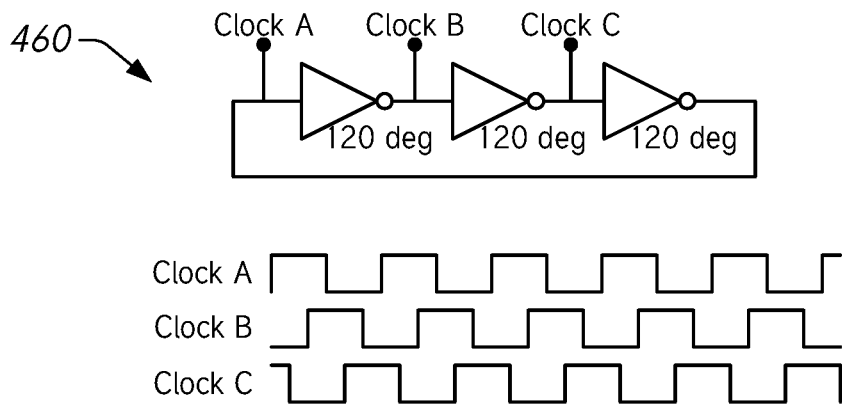
FIG. 4 illustrates an example charge pump that includes a plurality of parallel charge pump units.
Figure 4:
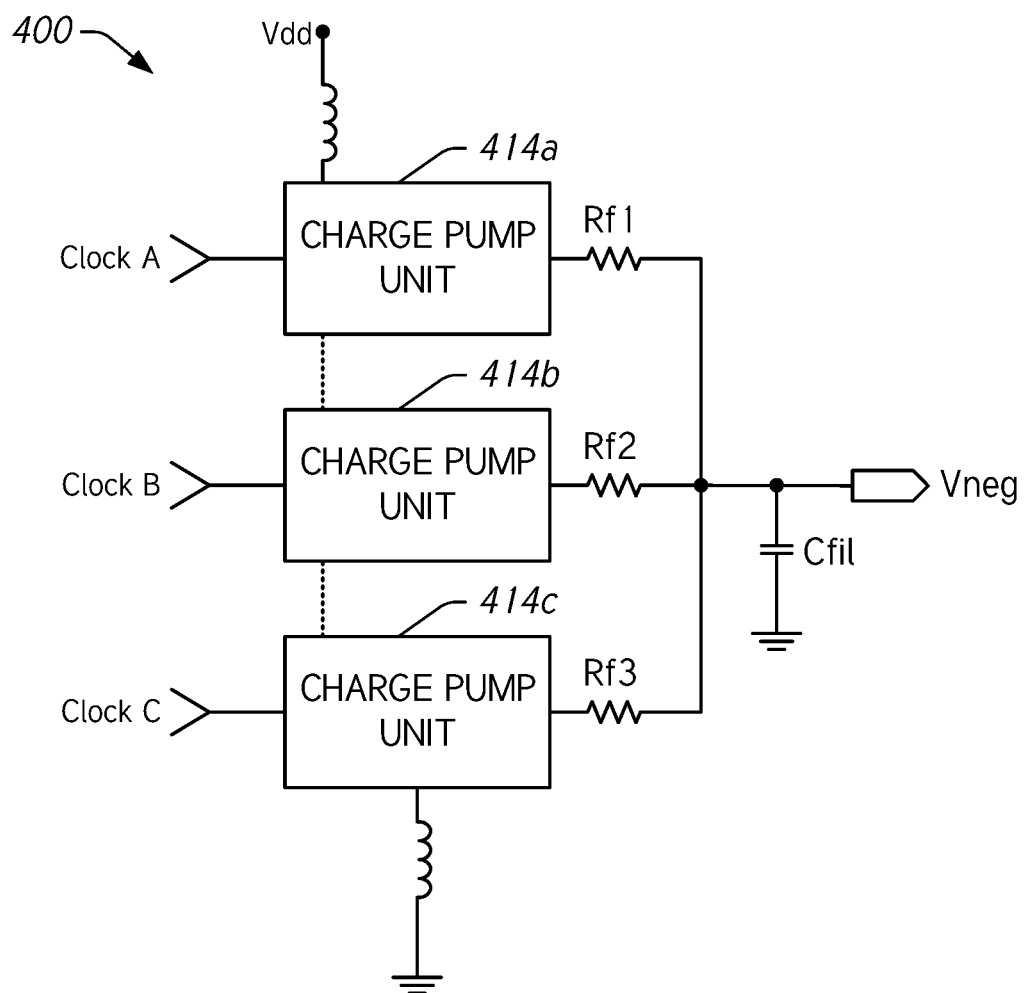

FIG. 4 illustrates an example charge pump 400 that includes a plurality of parallel charge pump units 414a-414c. The charge pump 400 can be used with any of the switch control circuitry disclosed herein. Similarly, the charge pump 400 can be used in conjunction with the level shifters described herein. However, it is to be understood that the disclosed control circuitry and level shifters can be used with any suitable charge pump or other voltage converters.

The charge pump 400 is configured to receive a voltage, Vdd, (such as from a battery, an LDO, or other voltage source), and to generate an output voltage, Vneg. Although three parallel charge pump units 414a-414c are illustrated, it is to be understood that any suitable number of parallel charge pump units may be used. For example, the charge pump 400 can include at least 2 parallel charge pump units, at least 3 parallel charge pump units, at least 4 parallel charge pump units, at least 5 parallel charge pump units, and so on. Similarly, the charge pump 400 can be configured to provide a positive and/or a negative voltage.

Each charge pump unit 414a-414c is coupled in series with a respective output resistor, Rf1-Rf3. In some embodiments, the output resistors have the same value of resistance. The charge pump units 414a-414c and output resistors are coupled in parallel to an output node with a filtering capacitor, Cfil, coupled between the output node and a reference potential node. In some embodiments, the charge pump units 414a-414c are identical or substantially identical to one another so that there is no significant difference between them.

The charge pump 400 receives clock signals for each charge pump unit 414a-414c. The clock signals are generated using a three-stage ring oscillator 460. The clock signals are offset in phase from one another to reduce spurs introduced by the charge pump 400. For example, for three charge pump units, the clock signals can be offset in phase 120 degrees from one another.

The charge pump units 414a-414c operate on the edge of the clock signal. For example, when an edge is present in the clock signal, the corresponding charge pump unit 414a-414c takes energy from a power supply to provide an output signal. Due at least in part to the charge pump units 414*a*-414*c* operating on different phases of the clock signal (or clock signals that are offset in phase), the voltage generated by the charge pump 400 can have reduced spurious signals, or spurs, relative to a charge pump with a single charge pump unit or multiple charge pump units that operate on the same clock signal (or phase-aligned clock signals). For example, conventional control of an RF switch can produce undesirable spurs (e.g., spurious tones) in the output signal of an RF switch. The clock signal may contribute clock feed-through spurs at a controller output, and eventually a switch output coupled to an antenna. In some embodiments, switch controllers can include a poly-phase (e.g., a "multi-phase") clocking scheme, as opposed to a single-phase scheme, to clock parallel charge pump units of a charge pump or voltage generator. In some implementations, poly-phase clocking schemes reduce the clock signal induced spurs and may preclude the need for additional off-chip decoupling capacitors that add to cost and module substrate area for a complete FEM solution.

Reduction of clock feed-through spurs may occur due at least in part to the individual charge pump units 414*a*-414*c* drawing current from a regulated supply (e.g., the supply of voltage Vdd) at different points in time due to the different clock phases received by the charge pump units. Thus, the momentary droop on the supply that results increases in frequency with additional charge pump units, which has the net effect of pushing out the dominant spur. In addition, by clocking each of the charge pump units 414*a*-414*c* of the charge pump 400 at different phases, and therefore different instances in time, the amplitude of the dip imposed on the regulated supply, and thus a battery feeding the supply, may be smaller because only one unit is drawing current while being switched on at a time. Consequently, the amplitude of the fundamental spur itself may be reduced by as much as a factor of two or more depending on the number of clock phases provided to the charge pump unit 400. Further description of this reduction in spurious signals is provided in U.S. Pat. No. 9,083,455, issued Jul. 14, 2015 and entitled "Reduced clock feed-through systems, methods, and apparatus," which is incorporated by reference herein in its entirety for all purposes.

Figure 5:
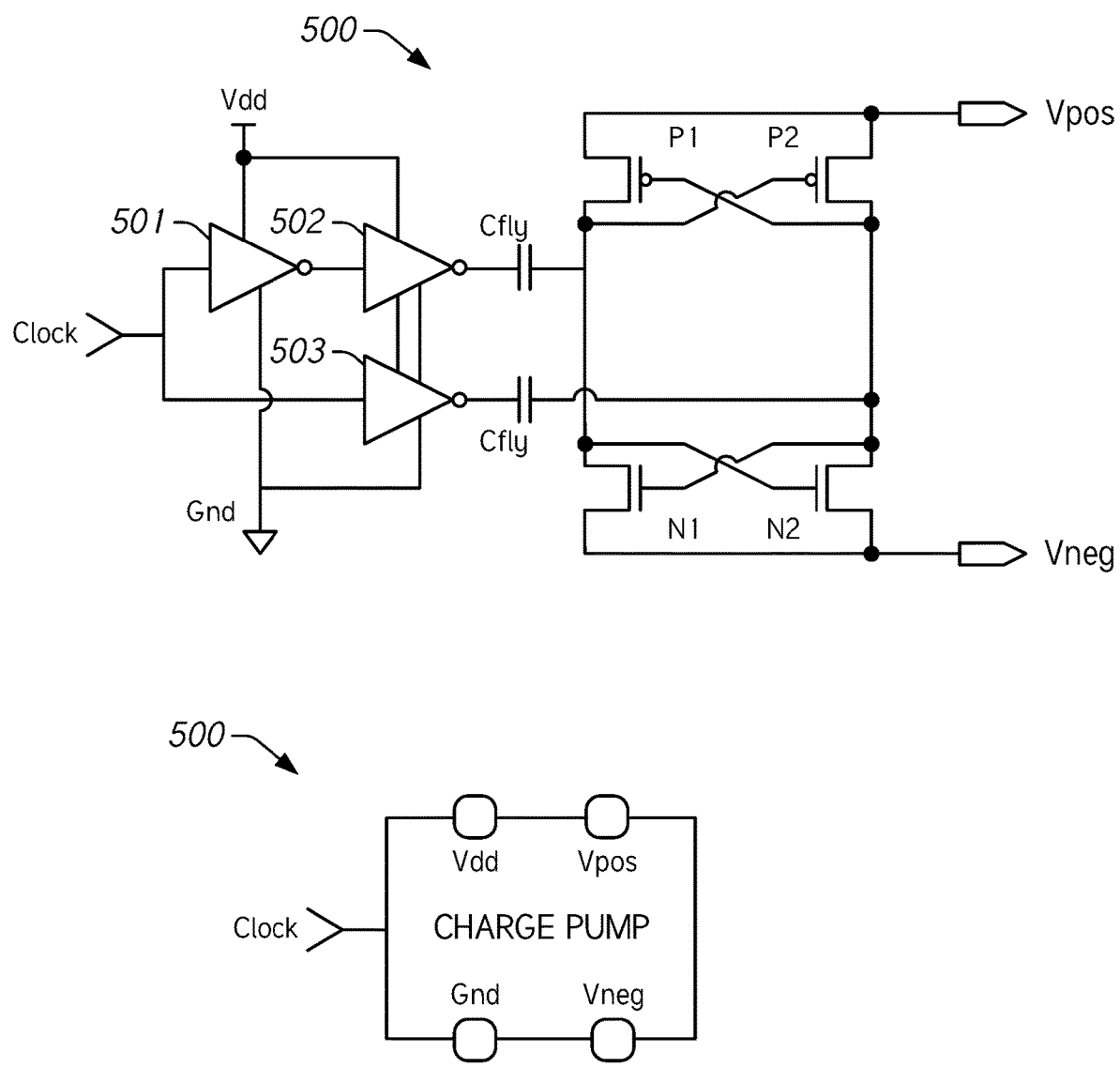
FIG. 5 illustrates another example of a charge pump that receives a clock signal and generates a positive voltage (Vpos) and a negative voltage (Vneg).

FIG. 5 illustrates another example of a charge pump 500 that receives a clock signal and generates a positive voltage (Vpos) and a negative voltage (Vneg). The charge pump can include input ports for receiving a digital supply voltage, Vdd, and for a reference potential node, Gnd, and output ports for the positive voltage (Vpos) and the negative voltage (Vneg). A particular embodiment of the charge pump 500 can include PMOS transistors P1, P2 coupled to the clock signal and NMOS transistors N1, N2 coupled to an inverse of the clock signal. These embodiments of the charge pump 500 can also include fly capacitors in series with the inverters that receive the clock signal and the supply voltage, Vdd. When the clock signal is high, P1 switches on and P2 switches off to route the positive voltage (e.g., the output of the clock signal through the inverters 501, 502 and fly capacitor) to the positive voltage port, Vpos, and N1 switches off and N2 switches on to route the negative voltage (e.g., the output of the clock signal through the inverter 503 and fly capacitor) to the negative voltage port, Vneg. Similarly, when the clock signal is low, P1 switches off and P2 switches on to route the positive voltage (e.g., the output of the clock signal through the inverter 503 and fly capacitor) to the positive voltage port, Vpos, and N1 switches on and N2 switches off to route the negative voltage (e.g., the output of the clock signal through the inverters 501, 502 and fly capacitor) to the negative voltage port, Vneg.

The charge pump 500 is also illustrated schematically to demonstrate inputs and outputs of the charge pump 500. The charge pump includes a clock input port, Clock, to receive a clock signal; a supply input port, Vdd, to receive a supply voltage; a ground port, Gnd, configured to couple to a reference potential node; a positive output port, Vpos, to provide a positive output voltage; and a negative output port, Vneg, to provide a negative output voltage. Internal to the charge pump 500, the clock signal is inverted and used to control cross-coupled transistors wherein two or more cross-coupled PMOS transistors provide a positive voltage at the positive output port, Vpos, and two or more cross-coupled NMOS transistors provide a negative voltage at the negative output port, Vneg.

Figure 6:
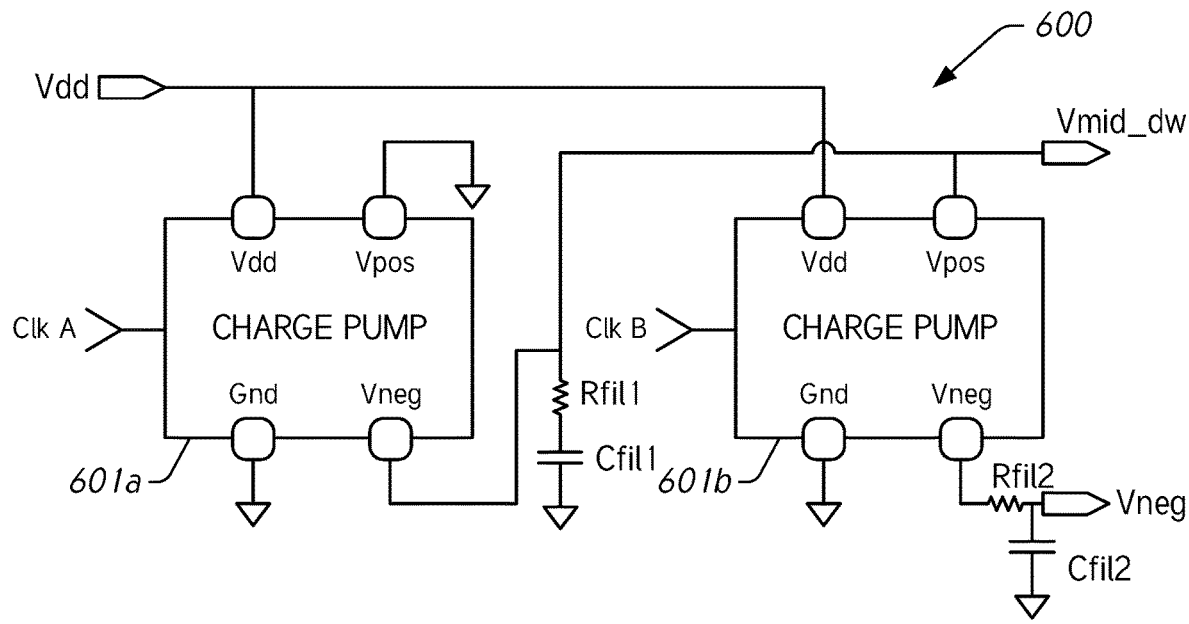
FIG. 6 illustrates an example negative voltage generator having two charge pump units coupled together to produce a negative voltage.
Figure 7:
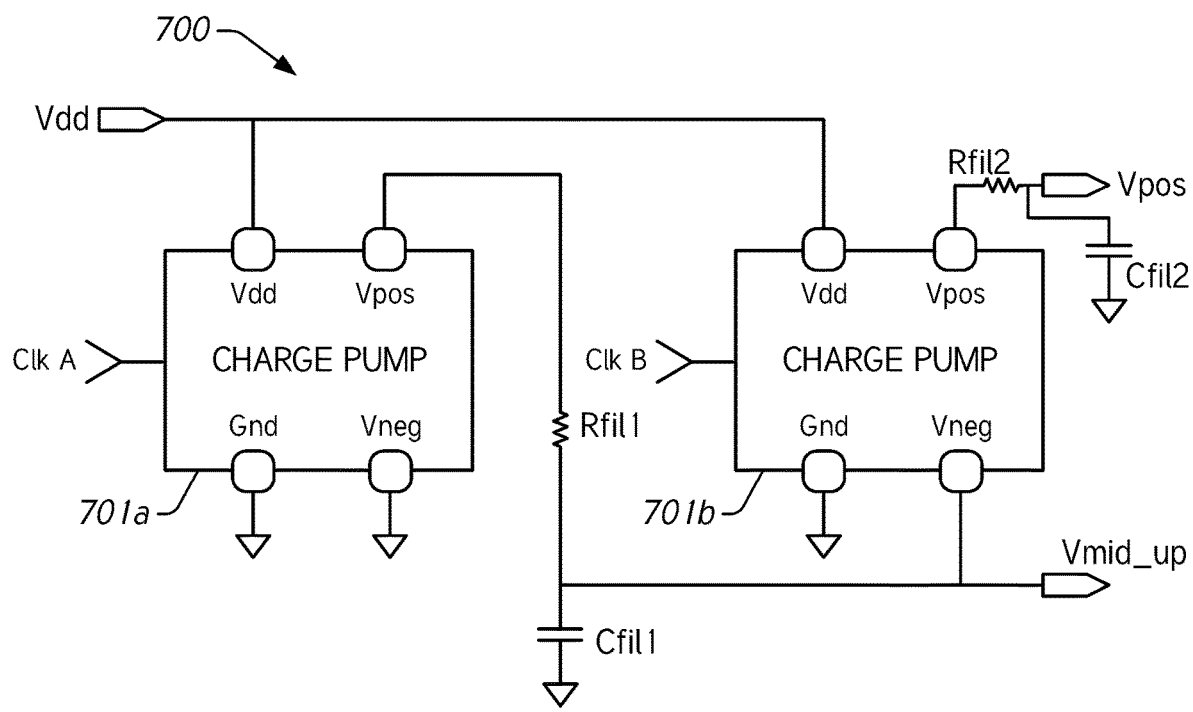
FIG. 7 illustrates an example positive voltage generator having two charge pump units coupled together to produce a positive voltage.

FIGS. 6 and 7 illustrate examples of voltage generators that stack charge pumps to generate larger negative or positive voltages. For both positive and negative voltage generation there is the possibility to cascade two or more charge pumps and to get a higher voltage. This may be useful when the battery voltage or supply voltage is relatively low and/or it is desirable to overdrive a switch in conjunction with a level shifter configured to provide a relatively large output voltage to improve performance (e.g., to have a better on resistance or $R_{on}$). In some embodiments, the input clock signals (e.g., Clk A, Clk B) for the charge pumps in the voltage generators of FIGS. 6 and 7 can be offset in time or have edges that are not aligned in time to reduce spurious signals at the output.

FIG. 6 illustrates an example negative voltage generator 600 having two charge pump units 601*a*, 601*b* coupled together to produce a negative voltage. For example, the positive voltage terminal of the charge pump unit 601*a* is coupled to a reference potential node, the negative voltage terminal of the charge pump unit 601*a* is coupled to a positive voltage terminal of the charge pump unit 601*b* with a filtering RC circuit coupled to ground (Rfil1, Cfil1), and a supply voltage, Vdd, is provided to the supply voltage ports of both charge pump units 601*a*, 601*b*. The negative terminal of the charge pump unit 601*b* provides the output negative voltage, Vneg, with a filtering resistor, Rfil2, and a filtering capacitor, Cfil2. The negative voltage generator 600 also generates a midpoint voltage, Vmid_dw, that can be utilized in the voltage level shifters disclosed herein, the midpoint voltage being tapped from the negative voltage output port of the first charge pump unit 601*a*. It is to be understood that this can be repeated for additional charge pump units, thereby providing additional midpoint voltages between the input voltage and the ultimate voltage provided by the negative voltage generator 600.

FIG. 7 illustrates an example positive voltage generator 700 having two charge pump units 701*a*, 701*b* coupled together to produce a positive voltage. For example, the negative voltage terminal of the charge pump unit 701*a* is coupled to a reference potential node, the positive voltage terminal of the charge pump unit 701*a* is coupled to a negative voltage terminal of the charge pump unit 701*b* through a filtering resistor, Rfil1, with a filtering capacitor, Cfil1, coupled to a reference potential node, and a supply voltage, Vdd, is provided to the supply voltage ports of both charge pump units 701*a*, 701*b*. The positive terminal of the charge pump unit 701*b* provides the output positive voltage, Vpos, with a second filtering resistor, Rfil2, and filtering capacitor, Cfil2. The positive voltage generator 700 also generates a midpoint voltage, Vmid_up, that can be utilized in the voltage level shifters disclosed herein. Again, it is to be understood that this can be repeated for additional charge pump units, thereby providing additional midpoint voltages between the input voltage and the ultimate voltage provided by the positive voltage generator 700.

A limitation for such implementations may be the overall increase in the size of the layout for corresponding switch control circuitry. However, a benefit of using a lower internal voltage, Vdd, and generating higher voltages from that is reverse power supply rejection which helps with the spur reduction into the power supply pins. Using different phases of a clock signal for the charge pump units can reduce the spurs and can decrease the turn-on time for RF switches. This may be particularly advantageous where the switch is a DPDT (e.g., switch 310a described herein with reference to FIG. 3) used in an asymmetrical CA uplink/downlink and the wireless device is used simultaneously for GSM voice and LTE data with one or two operators.

Figure 8:
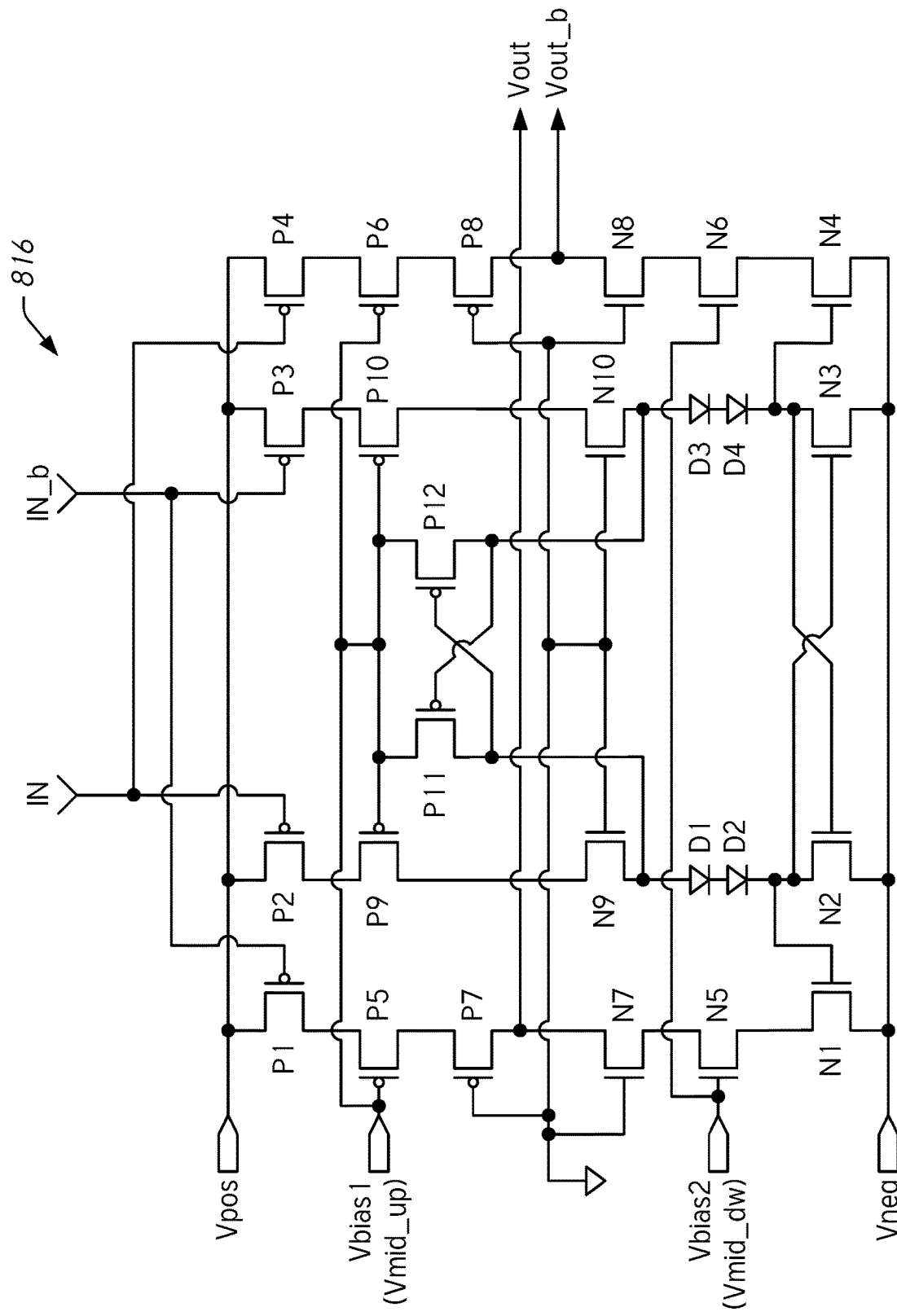
FIG. 8 illustrates a circuit diagram of an example voltage level shifter configured to receive a negative voltage, to receive a positive voltage, and to generate complementary output voltage values that correspond to the negative voltage and to the positive voltage or vice versa.

FIG. 8 illustrates a circuit diagram of an example voltage level shifter 816 configured to receive a negative voltage, Vneg (e.g., from a power supply, a charge pump, or negative voltage generator), to receive a positive voltage, Vpos (e.g., from a power supply, a charge pump, or positive voltage generator), and to generate complementary output voltage values at Vout and Vout_b that correspond to the negative voltage, Vneg, and to the positive voltage, Vpos, or vice versa. The voltage level shifter 816 can be configured to shift a voltage level of an input signal to a targeted our desired output range. For example, the output signal can have a magnitude of at least about 4 V that is controlled by an input signal that has a magnitude of about 1 V, about 1.2 V, about 2.5 V, or about 3.3 V. The voltage level shifter 816, along with a voltage generator or charge pump, can be part of control circuitry for a switch.

The voltage level shifter 816 includes biasing networks to provide suitable bias voltages Vbias1, Vbias2 to gates of PMOS transistors P5 and P6 (for Vbias1) and to gates of NMOS transistors N5 and N6 (for Vbias2) of the voltage level shifter 816. In some embodiments, Vbias1 can be provided by extracting a voltage Vmid_up from a charge pump, as described herein with reference to FIG. 7. In certain embodiments, Vbias2 can be provided by extracting a voltage Vmid_dw from a charge pump, as described herein with reference to FIG. 6. A reference potential node can be used to bias the transistors P7, N7, P8, N8, N9, N10. In some embodiments, the voltage level shifter can provide 3 bias levels for the transistors that divide the voltage difference between the high input voltage (e.g., Vpos) and the low input voltage (e.g., Vneg). For example, where Vpos and Vneg are actually both positive voltages rather than a positive voltage and a negative voltage, Vbias1 can be a voltage close to but lower than Vpos, Vbias2 can be a voltage close to but higher than Vneg, and the reference potential node can be replaced with a bias voltage between Vbias1 and Vbias2.

In some embodiments, the voltage level shifter 816 can be configured to receive the negative voltage Vneg from a charge pump as described herein with reference to FIG. 4 or 5. In certain embodiments, the voltage level shifter 816 can be configured to receive the negative voltage Vneg from a negative voltage generator as described herein with reference to FIG. 6. Similarly, in some embodiments, the voltage level shifter 816 can be configured to receive the positive voltage Vpos from a charge pump as described herein with reference to FIG. 4 or 5. In certain embodiments, the voltage level shifter 816 can be configured to receive the positive voltage Vpos from a positive voltage generator as described herein with reference to FIG. 7. In various implementations, the voltage level shifter 816 can be configured to receive the voltage Vbias1 or Vmid_up from a positive voltage generator as described herein with reference to FIG. 7. Similarly, in certain implementations, the voltage level shifter 816 can be configured to receive the voltage Vbias2 or Vmid_dw from a negative voltage generator as described herein with reference to FIG. 6.

The voltage level shifter 816 includes a first outer transistor stack that includes three stacked PMOS transistors P1, P5, P7 and three stacked NMOS transistors N1, N5, N7, all of which are connected in series between Vpos and Vneg. The output voltage, Vout, is taken from between the stacked PMOS transistors and the stacked NMOS transistors in the first outer transistor stack. The voltage level shifter 816 includes a second outer transistor stack that includes three stacked PMOS transistors P4, P6, P8 and three stacked NMOS transistors N4, N6, N8, all of which are connected in series between Vpos and Vneg. The complementary output voltage, Vout_b, is taken from between the stacked PMOS transistors and the stacked NMOS transistors in the second outer transistor stack.

The voltage level shifter 816 includes a first inner transistor stack that includes two stacked PMOS transistors P2, P9 and two stacked NMOS transistors N2, N9 with two diodes D1, D2 between the NMOS transistors, all of which are connected in series between Vpos and Vneg. The voltage level shifter 816 includes a second inner transistor stack that includes two stacked PMOS transistors P3, P10 and two stacked NMOS transistors N3, N10 with two diodes D3, D4 between the NMOS transistors, all of which are connected in series between Vpos and Vneg.

The transistors N2 and N3 from the first and second inner transistor stacks are cross-coupled to aid in controlling the outputs of the voltage level shifter 816. The voltage level shifter 816 also includes inner PMOS transistors P11, P12 that are cross-coupled to further aid in controlling the outputs of the voltage level shifter 816.

The input signal, IN, is used to bias PMOS transistors P2, P4 and the complementary input signal, IN_b, is used to bias PMOS transistors P1, P3. Vbias1 is used to bias PMOS transistors P5, P6, P9, P10, P11, P12. The reference potential node is used to bias PMOS transistors P7, P8 and to bias NMOS transistors N7, N8, N9, N10. Vbias2 is used to bias NMOS transistors N5, N6. This is done to divide the voltage drops across the series transistors to improve performance and to enable the voltage level shifter 816 to provide increased voltage outputs relative to typical voltage level shifters.

The base of NMOS transistor N2 is coupled to the drain of NMOS transistor N3 and the base of NMOS transistor N3 is coupled to the drain of NMOS transistor N2, thus N2 and N3 are cross-coupled. Thus, when P3 of the second inner transistor stack receives a high signal from IN_b and P2 of the first inner transistor stack receives a low signal from IN, N2 is turned on and N3 is turned off. Similarly, when P3 of the second inner transistor stack receives a low signal from IN_b and P2 of the first inner transistor stack receives a high signal from IN, N3 is turned on and N2 is turned off.

The base of NMOS transistor N1 is coupled to the drain of NMOS transistor N2. The base of NMOS transistor N4 is coupled to the drain of NMOS transistor N3. Thus, when N2 is on, N1 is off and Vout is pulled up to Vpos. Furthermore, when N3 is off, N4 is on and Vout_b is pulled down to Vneg. Similarly, when N3 is on, N4 is off and Vout_b is pulled up to Vpos. Furthermore, when N2 is off, N1 is on and Vout is pulled up to Vneg.

The drain of PMOS transistor P11 is coupled to the base of NMOS transistor N1 through the diodes D1, D2. In addition, the drain of PMOS transistor P12 is coupled to the base of NMOS transistor N4 through the diodes D3, D4. Thus, when N2 is on, P12 is on and contributes to the voltage and current provided to the base of N4 while it is on. Similarly, when N3 is on, P11 is on and contributes to the voltage and current provided to the base of N1 while it is on. In some embodiments, transistors P11 and P12 help to enable the voltage level shifter 816 to provide relatively large voltage swings for SOI switch implementations.

The voltage level shifter 816 receives input signals, IN and IN_b, that control the output signals, Vout and Vout_b. The input signal IN is sent to gates of PMOS transistors P2 and P4 and the input signal IN_b is sent to gates of PMOS transistors P1 and P3 to control the output signals Vout and Vout_b. For example, when IN is high and IN_b is low, P1 and P3 are on and P2 and P4 are off. This activates N2 in the first inner transistor stack de-activates N1 in the first outer transistor stack. Thus, Vout is pulled up to have a value about equal to Vpos because P1 is on and N1 is off. Furthermore, with N2 being on, N3 of the second inner transistor stack is off and inner PMOS transistor P12 is on. This activates N4 of the second outer transistor stack. Thus, Vout_b is pulled down to have a value about equal to Vneg because P4 is off and N4 is on. Therefore, a high IN signal results in approximately Vpos at Vout and approximately Vneg at Vout_b.

Similarly, when IN is low and IN_b is high, P1 and P3 are off and P2 and P4 are on. This activates N3 in the second inner transistor stack de-activates N4 in the second outer transistor stack. Thus, Vout_b is pulled up to have a value about equal to Vpos because P4 is on and N4 is off. Furthermore, with N3 being on, N2 of the first inner transistor stack is off and inner PMOS transistor P11 is on. This activates N1 of the first outer transistor stack. Thus, Vout is pulled down to have a value about equal to Vneg because P1 is off and N1 is on. Therefore, a low IN signal results in approximately Vneg at Vout and approximately Vpos at Vout_b.

The voltage level shifter 816 illustrates an example embodiment of a level shifter that can be used in the switch control circuitry described herein. However, other configurations of level shifters can be used in accordance with the teachings herein. For example, additional transistors can be used in the outer transistor stacks to improve performance when shifting between large voltage values. As another example, additional cross-coupled transistors can be used to bias transistors in the inner and/or outer transistor stack to aid in pulling up or pulling down the output voltages to the provided upper and lower voltages (e.g., Vpos and Vneg). As another example, both Vpos and Vneg can be positive voltages or both can be negative voltages. As another example, Vpos can be at ground or Vneg can be at ground.

Figure 9:
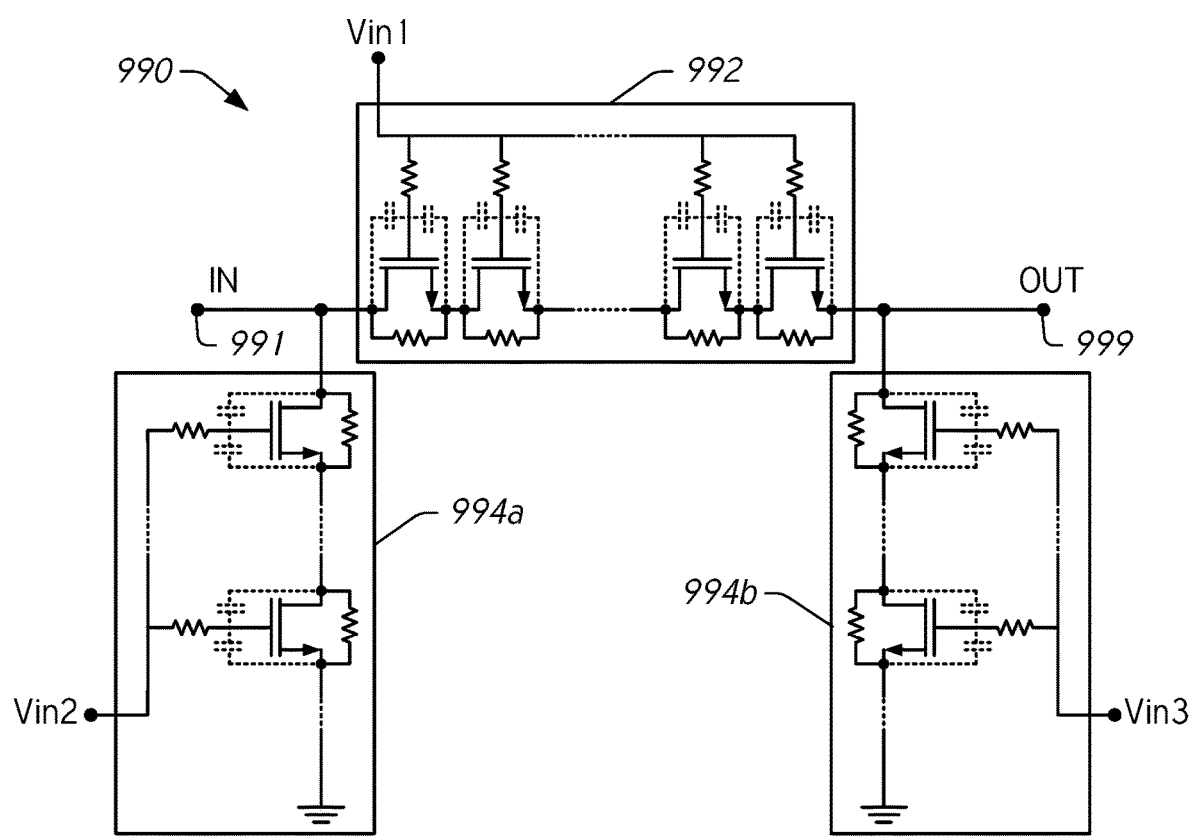
FIG. 9 illustrates an example switch for RF applications.

FIG. 9 illustrates an example switch 990 for RF applications. The switch 990 is configured to receive an input signal (e.g., an RF signal) at an input port 991 and to provide the RF signal at an output port 999 when the switch is in an ON state. The switch 990 includes a series arm 992 and shunts 994a, 994b. A typical antenna switch may experience a swing of up to about 30 V due to a combination of high power and mismatch at the antenna. To withstand such high voltages, the switch 990 includes multiple stacked FETs to form a 'switch arm.' The switch 990 is in a series-shunt configuration wherein the series arm 992 provides a low-resistance path for the signal between the input port 991 and the output port 999 in the ON state, and the shunt arms 994a, 994b provide a low-resistance path for the signal power to ground to reduce or prevent current that may leak to the output port 999 in the OFF state.

The series FETs in the switch 990 can be configured to handle relatively high RF power when the switch is in the OFF state and to provide relatively low insertion loss when the switch is in the ON state. In the OFF state, the input port 991 is grounded with a shunt arm 994a to provide isolation. The switch 990 ON/OFF states are controlled through a positive voltage and a negative voltage applied on the FET gates. In the OFF state the stacked transistors provide a voltage divider that effectively limits the voltage Vgs and Vgd across each transistor.

The series arm 992 is controlled by the voltage Vin1 while the shunt arms 994a, 994b are respectively controlled by voltages Vin2 and Vin3. Each of the control voltages Vin1, Vin2, and Vin3 can be provided by a dedicated voltage level shifter, such as the voltage level shifter 816 described herein with respect to FIG. 8. To turn the switch 990 to the ON state, a positive voltage can be applied at the input of the series arm 992. To turn the switch 990 to the OFF state, a negative voltage can be applied at the input of the series arm 992. In the ON state of the switch 990, a negative voltage can be provided to the shunt arms 994a, 994b. In the OFF state of the switch 990, a positive voltage can be provided to the shunt arms 994a, 994b.

When commuting the switch 990 from one state to another state, it may be advantageous to provide additional power or energy. When that operation is finished, it then may be advantageous to reduce the power consumed and/or the noise generated in the switch 990. Accordingly, charge pumps and/or voltage generators as described herein can be part of the control circuitry that provides the voltages to the series arm 992 and the shunt arms 994a, 994b. Such charge pumps can dynamically activate and de-activate charge pump units to meet power and/or speed performance targets. For example, when it is advantageous to quickly switch between a positive and negative voltage (e.g., when commuting a switch between ON and OFF states), a charge pump may activate all of its charge pump units operating on different phases of a clock signal. Similarly, when it is advantageous to provide a relatively high power, a charge pump may activate all of its charge pump units. Furthermore, once the charge pump is near a targeted voltage, one or more of the charge pump units can be de-activated to reduce power consumption of the switch. In some embodiments, charge pump units with parallel charge pump units can be used where it is desirable to provide a targeted voltage and power to a switch while reducing noise from spurious tones introduced by the charge pump. This can be accomplished using the disclosed charge pumps due at least in part to the charge pump units operating on different phases of a clock signal.

Figure 10:
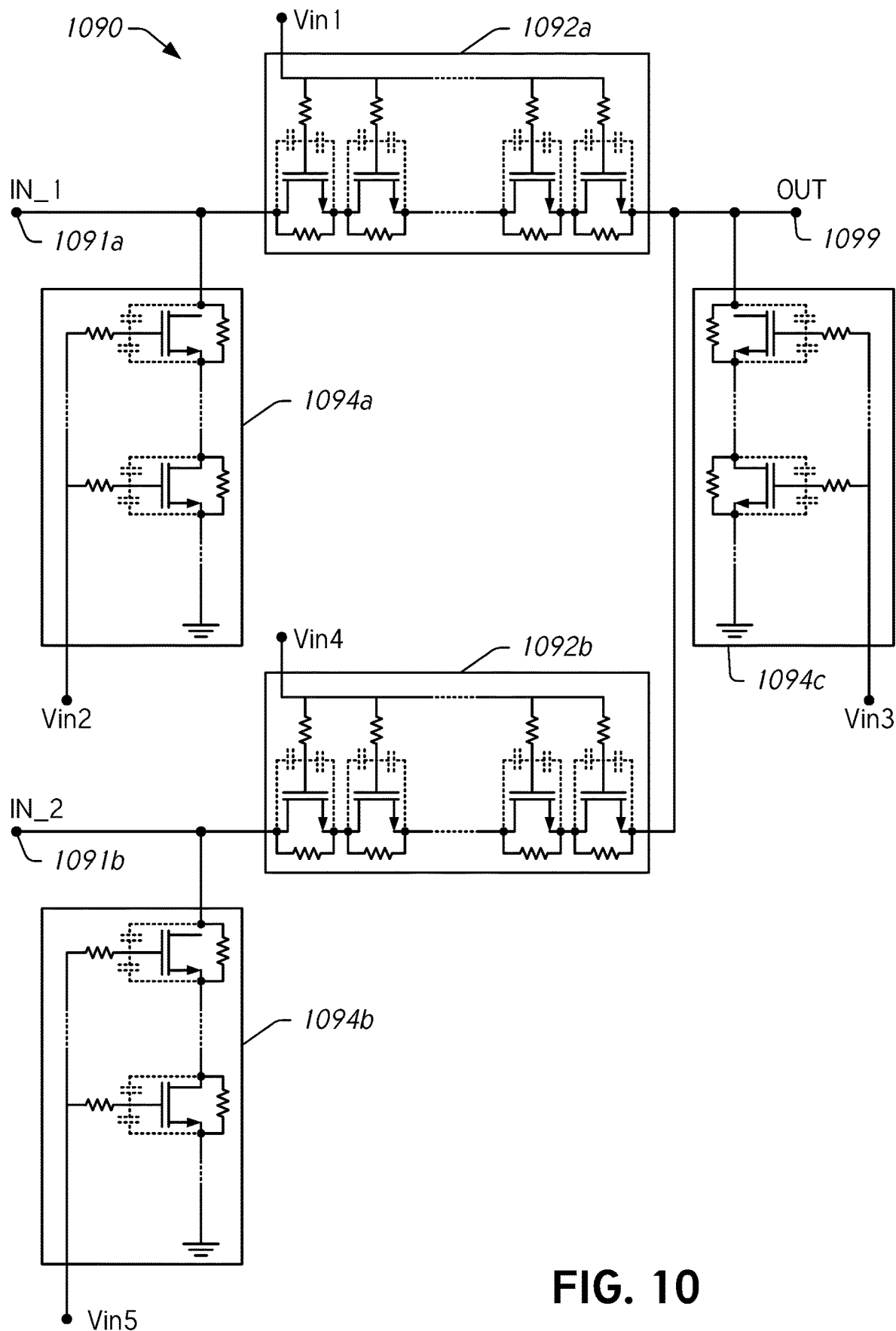
FIG. 10 illustrates a double pole, single throw (DPST or 2PST) switch with series arms and shunt arms.

FIG. 10 illustrates a double pole, single throw (DPST or 2PST) switch 1090 with series arms 1092a, 1092b and shunt arms 1094a-1094c. Each control voltage Vin1-Vin5 can be provided by a voltage level shifter, such as the voltage level shifter 816 described herein with respect to FIG. 8. In some embodiments, one or more of the control voltages Vin1-Vin5 can be provided by a charge pump or voltage generator, such as the charge pumps and voltage generators described herein with reference to FIGS. 1, 2, and 4-7.

The DPST switch 1090 includes a first input port 1091a and a second input port 1091b that can be selectively coupled to an output port 1099 through the series arms 1092a and 1092b, respectively. The shunt arms 1094a, 1094b can be configured to selectively isolate the input ports 1091a, 1091b as appropriate. The shunt arm 1094c can be configured to reduce leakage currents at the output port 1099. The series arm 1092a can receive a positive voltage to couple the first input 1091a to the output 1099, thereby turning the first switch arm to an ON state. The series arm 1092b can receive a positive voltage to couple the second input to the output 1099, thereby turning the second switch arm to an ON state. In each case, the other series arm can receive a negative voltage to turn that arm of the switch to the OFF state. At various times, both switch arms can be in the OFF state. In some embodiments, the switch 1090 can be configured to provide acceptable performance where the positive voltage to negative voltage swings can be from about 3.5 V to about −4 V.

Figure 11:
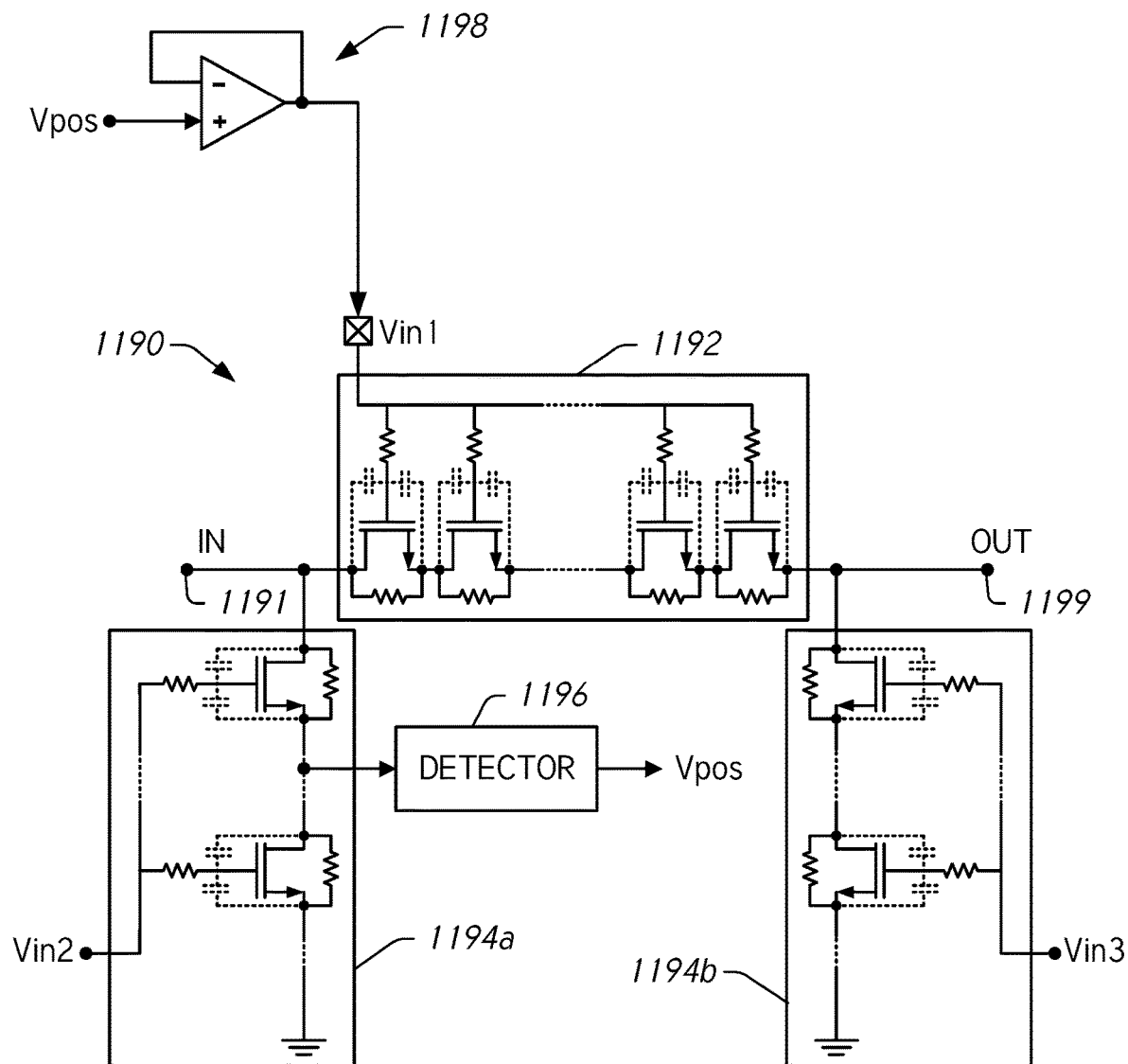
FIG. 11 illustrates a switch having a power detector to provide feedback to the control circuitry to enable dynamic control of voltages at a series arm.

FIG. 11 illustrates a switch 1190 having a power detector 1196 to provide feedback to the control circuitry to enable dynamic control of voltages at a series arm 1192. It is understood that switch performance may be improved by applying higher voltages on the gates of switch arm transistors. However, it may be disadvantageous to apply these higher voltages over long periods of time as they may cause ill effects such as device degradation. Accordingly, it may be beneficial to apply higher voltages when it positively affects switch performance at advantageous times, such as when a relatively high signal passes through a switch. Thus, the switch 1190 includes a power detector on a shunt arm 1194a configured to detect a power of the signal through the shunt arm 1194a. When a high signal is detected and the switch is to be in the ON state, the power detector 1196 can provide a signal indicating the increased power. A feedback mechanism 1198 can receive this signal from the power detector 1196 and provide increased voltage to the series arm 1192. This can advantageously reduce Ron of the switch based on detected power, which can improve harmonics.

Implementation Considerations for Disclosed SOI Switches

The disclosed control circuitry for SOI switches may provide a number of benefits. In particular, benefits may be particularly pronounced in wireless devices that employ carrier aggregation (CA), multiple input multiple output (MIMO), and the like. Accordingly, provided herein are some examples of implementation considerations when utilizing the disclosed control circuitry and switches.

Figure 12:
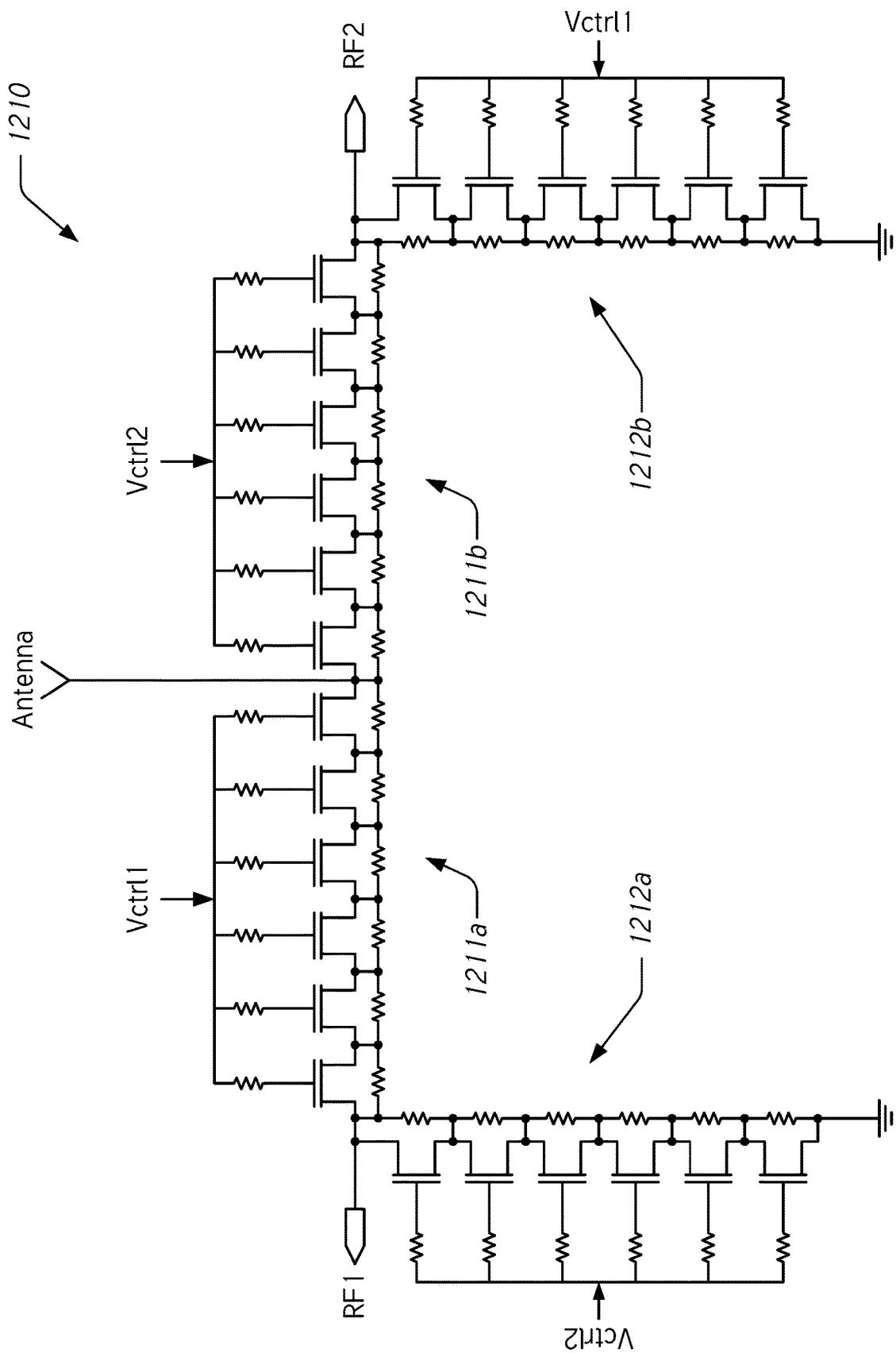
FIG. 12 illustrates an example structure of an SOI switch configured to receive an RF signal from an antenna and to direct the signal to a first output or to a second output.

FIG. 12 illustrates an example structure of an SOI switch 1210 configured to receive an RF signal from an antenna and to direct the signal to a first output, RF1, or to a second output, RF2. The switch 1210 includes a first series arm 1211a controlled by a first control voltage, e.g., Vctrl1, a second series arm 1211b controlled by a second control voltage, e.g., Vctrl2, a first shunt arm 1212a controlled by the second control voltage and a second shunt arm 1212b controlled by the first control voltage. To direct signals from the antenna to the first output, the first series arm 1211a and the second shunt arm 1212b can be activated or turned on using a positive voltage while the second series arm 1211b and the first shunt arm 1212a can be de-activated or turned off using a negative voltage. Similarly, to direct signals from the antenna to the second output, the first series arm 1211a and the second shunt arm 1212b can be de-activated or turned off using a negative voltage while the second series arm 1211b and the first shunt arm 1212a can be activated or turned on using a positive voltage.

To improve performance of the switch 1210, the positive voltage used to activate or turn on the series arms and the shunt arms can be increased. This can improve the on resistance or Ron. Similarly, to improve performance of the switch 1210 in cellular communications applications, the negative voltage can be increased to provide better power handling. Improved power handling may be particularly beneficial in cellular devices implementing technology for Long Term Evolution Advanced (LTE-A) communications.

LTE-Advanced was established with a principle focus being to provide higher bitrates in a cost-efficient way and to fulfill requirements set by the standard referred to as 4G. New functionalities introduced in LTE-Advanced include carrier aggregation (CA), enhanced use of multi-antenna such as multiple input multiple output (MIMO), and support to relay nodes (RNs) for heterogeneous network planning of large and small cells. A straightforward way to increase capacity is to add more bandwidth through aggregation of carriers. Carrier aggregation can be used for both Frequency Division Duplex (FDD) and Time Division Duplex (TDD). Each aggregated carrier can have a bandwidth of 1.4, 3, 5, 10, 15 or 20 MHz and a maximum of five component carriers can be aggregated; therefore, the maximum bandwidth is 100 MHz. MIMO can be used to increase the overall bitrate through transmission of two (or more) different data streams on two (or more) different antennas. MIMO can be used when SNR (Signal to Noise ratio) is high and for situations with low SNR it may be preferable to use Tx-diversity.

LTE-Advanced Pro is the formal name of the recent 4.5G standard. The new standard includes features such as Licensed Assisted Access (LAA) and Massive Carrier Aggregation and Massive MIMO. LTE-Advanced Pro can improve network data speed reaching about 1 Gbs. The potential gain in performance for a MIMO system may be mitigated by the increased cost of the number of relatively expensive radio-frequency (RF) hardware components. To reduce the complexity of deploying MIMO technology, a complexity reduction technique known as antenna selection/swap can be applied. The antenna swap can be done through a relatively low-cost RF swap switch with dual pole dual throw (DPDT), as described in greater detail herein with reference to FIG. 3.

RF switches may be tasked to maintain the signal linearity and to provide isolation between transmit and receive chains, with the lowest insertion loss possible. Furthermore, wireless data communications have moved towards the use of higher-order modulation schemes such as OFDM and OFDMA. These modulation schemes yield waveforms that vary widely in amplitude, resulting in high peak-to-average-power-ratio (PAPR) signals that demand increased dynamic range from the components that relay and process the signals and demand relatively high linearity from the antenna switches to reduce distortion within the RF signal path.

For carrier aggregation, switch linearity and noise reduction may be of particular importance. By way of example, where a wireless device provides 2 uplink signals (e.g., 1 in a low band and 1 in a mid-band), both uplink signals may be routed to an antenna through a DPDT switch, as described herein. If the first signal is designated Tx1 and the second signal is designated Tx2, signals generated by charge pumps may produce tones which land in the receive bandwidth zone, reducing the SNR of the receive signal.

For example, based on geographical use several low band transmit/receive bands (698 MHz-960 MHz) and medium band transmit/receive bands (1427 MHz-2200 MHz) can be aggregated through two diplexers and can feed the main and/or diversity antennas using the DPDT switch. The targeted linearity for the DPDT switch is relatively high due at least in part to potential noise falling within the receive bandwidth of particular cellular frequency bands. For example, when B17 (Tx frequencies 704 MHz-716 MHz) is aggregated with B4 (Rx frequencies 2110 MHz-2155 MHz) the low-band power amplifier third harmonic interferes with the mid-band receive signal. In some implementations, such interference means that wireless communications systems would need switches with about −100 dBm whereas typical switches are about −80 dBm.

Similarly, as another example, when B3 is aggregated with B8, interference may arise from third order terms. Assuming sensitivity of a typical LTE 5 MHz (25 RBs) signal as about −105 dBm, with about 4.5 dB margin, the linearity requirement IIP$_3$ measured with two Tx1 and Tx2 signals at 28 dBm (to avoid self-jamming) is given by:

$$IIP_3 = \frac{P_{B3} + 2P_{B8} - P_{IMD}}{2} = \frac{28 + 2*28 - (-105)}{2} = 94.5 \ dBm \quad (1)$$

Assuming a B3 Tx2 uplink signal at 28 dBm, no Tx1 signal active, and an external blocker at −15 dBm, the linearity requirement IIP$_2$ is given by:

$$IIP_2 = P_{blk} + P_{B3} - P_{IMD} = -15 + 28 - (-105) = 118 \ dBm \quad (2)$$

When both uplink Tx1 and Tx2 signals are active in the presence of an agnostic blocker, the IMD product can land in the receive FDD channel. This can be referred to as "triple beat interference" and there are several scenarios to consider when determining targeted linearity performance.

RF Switches with several series FETs can handle high RF power when the switch is in the OFF state and can provide low insertion loss when the switch is in the ON state. In the OFF state, the RF port can be grounded with a switch to provide high isolation. Switch ON/OFF states can be controlled through a positive voltage ($V_{POS}$) and a negative voltage ($V_{NEG}$) applied on the FET gates. In the OFF state, the stacked transistors can provide a voltage divider that limits the voltage $V_{gs}$ and $V_{gd}$ across each transistor at $V_{Tx}/(2n)$. The peak RF voltage across the drain-source for each transistor (assuming equal voltage division for each FET transistor) is:

$$|V_{DS\_peak}| = 2(V_{th} - V_{NEG}) \quad (3)$$

The number of the series FETs (n) is based at least in part on the maximum RF power applied to the switch. The breakdown requirements for CMOS/SOI transistors is determined as:

$$P_{max} = \frac{V_{Tx\_max}^2}{2*Z_0} = \frac{2(nV_{DS\_peak})^2}{Z_0} \quad (4)$$

Due at least in part to the coupling between OFF state FETs and the RF ground, there is no equally divided voltage across FETs in the OFF state and Equation (3) has to be changed to reflect the physical switch. Another method uses transient simulations to determine the voltage drop across each FET and to determine a safe region of operation. The rule of thumb for FETs operating in breakdown for RF operation is that Vds does not have to exceed two times the $V_{BV\_OXIDE}$ which is the value for DC and low frequency operation (less than 5 MHz). In the ON state, the switch presents a low insertion loss given by:

$$IL = -20 \log \frac{2Z_0}{2Z_0 + R_{on}} \quad (5)$$

The formula for R$_{on}$ is:

$$R_{on} \propto \frac{n}{W_g(V_{POS} - V_{th})} \quad (6)$$

where $W_g$ is the FET gate width and $V_{POS}$ is the control voltage for the ON state. Also, in the ON state the voltage between gate-drain and gate-source is quasi constant and set by the $V_{POS}$ to provide isolation from gate/bulk losses. The control voltage $V_{POS}$ can be configured to not exceed the DC breakdown voltage. The resistors that provide the bias and isolation for the FETs have a relatively high value and is expressed as:

$$R_g \gg \frac{1}{2\pi(C_{gs} + C_{gd})} \quad (7)$$

Equation (7) provides the resistive part for the impedance presented by switch FETs in the ON state. A figure of metric (FOM) for switches is the product of ON resistance of the switch with its respective OFF state capacitance ($R_{on} \times C_{off}$), which is expressed in femtoseconds. Silicon on Insulator (SOI) technologies on high resistivity substrate have a FOM in a range of about 200 fs to about 120 fs. Due at least in part to improvements and desires for reduced cost and improved performance, other switch technologies such as Silicon-on-Sapphire (SOS), Gallium Arsenide (GaAs), and CMOS may be less advantageous to CMOS Silicon-on-Insulator technology to deliver high-linearity, low-loss RF switches.

As described herein, control circuitry can be directly connected to a battery or other voltage source and provide positive and negative voltages to turn the switch ON and OFF. A charge pump can be configured to generate a negative voltage Vneg where Vneg=−Vdd, with Vdd being the internal voltage generated by a voltage regulator such as an LDO. A similar circuit can be used to generate a positive voltage higher than Vdd, e.g., Vpos=2Vdd. Similarly, a charge pump can be used to generate a negative voltage that is a multiple of the supply voltage, Vdd. In some embodiments, the control circuitry can be configured to use charge pumps to provide a positive voltage of about 3.5 V and a negative voltage of about −4 V. The disclosed voltage level shifters can switch between these positive and negative voltages to improve switch performance.

In some embodiments, charge pumps can be used to generate the positive and/or negative voltages. For both positive and negative voltage generation two or more charge pumps can be cascaded and the disclosed voltage level shifters can be implemented to control switch arms which may be useful when battery voltage is low and it is desirable to overdrive a switch to get better on resistance, $R_{on}$. A benefit of using a lower internal voltage, Vdd, may be that the reverse power supply rejection reduces spurs into the power supply pins.

Examples of Implementations in Products

Various examples of FET-based switch circuits and bias/coupling configurations described herein can be implemented in a number of different ways and at different product levels. Some of such product implementations are described by way of examples.

Semiconductor Die Implementation

SOI transistors utilize a positive voltage on the gate to turn the FET stack "on" and utilizes a negative bias to turn the FET stack "off." A positive and/or negative voltage may be generated on chip by the disclosed charge pumps and provided through the disclosed voltage level shifters and distributed to the FETs based on a logic decode function that is also integrated on die.

Figure 13A:
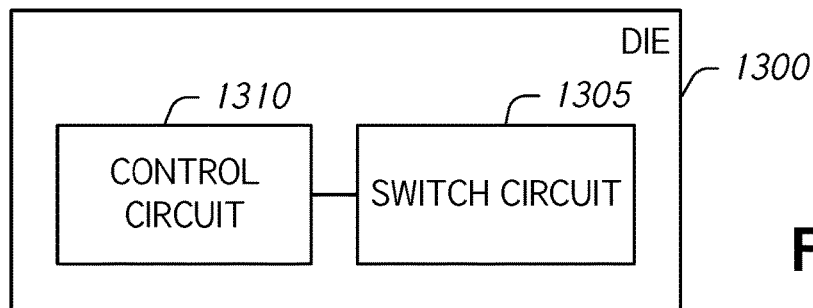
FIGS. 13A, 13B, 13C, and 13D schematically illustrate non-limiting examples of switch circuit implementations on one or more semiconductor die.
Figure 13B:
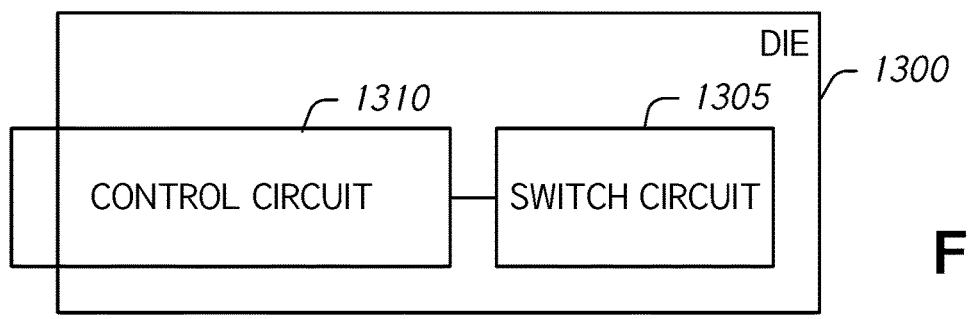
Figure 13C:
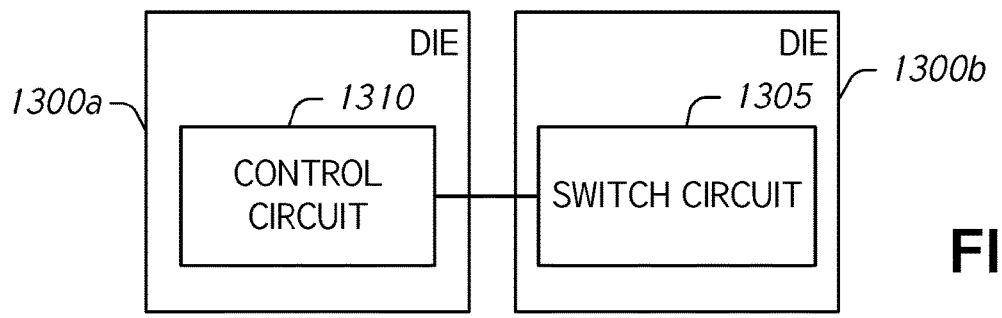
Figure 13D:
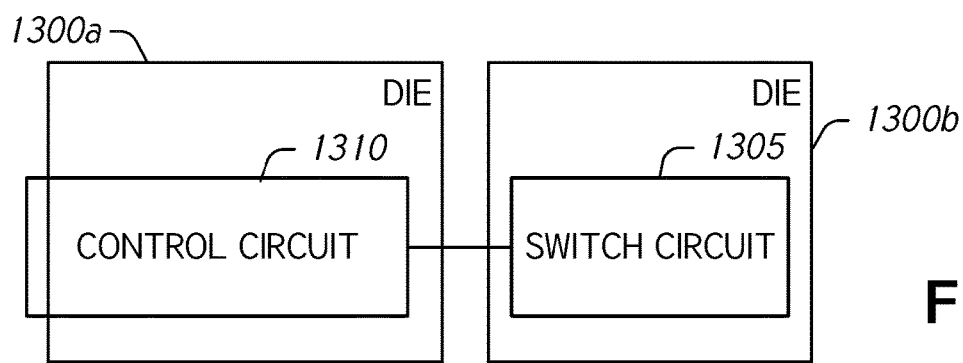

FIGS. 13A-13D schematically illustrate non-limiting examples of such implementations on one or more semiconductor die. FIG. 13A illustrates a switch circuit 1305 and a control circuit 1310 having one or more features as described implemented on a die 1300. The control circuit 1310 can include a charge pump, examples of which are described herein with reference to FIGS. 1, 2, and 4-7, and/or a voltage level shifter, examples of which are described herein with reference to FIGS. 1, 2, and 8. FIG. 13B illustrates that at least some of the control circuit 1310 can be implemented outside of the die 1300 of FIG. 13A. FIG. 13C illustrates that a switch circuit 1305 having one or more features as described herein can be implemented on a second die 1300b, and a control circuit 1310 having one or more features as described herein can be implemented on a first die 1300a. FIG. 13D illustrates that at least some of the control circuit 1310 can be implemented outside of the first die 1300a of FIG. 13C.

Packaged Module Implementation

Figure 14A:
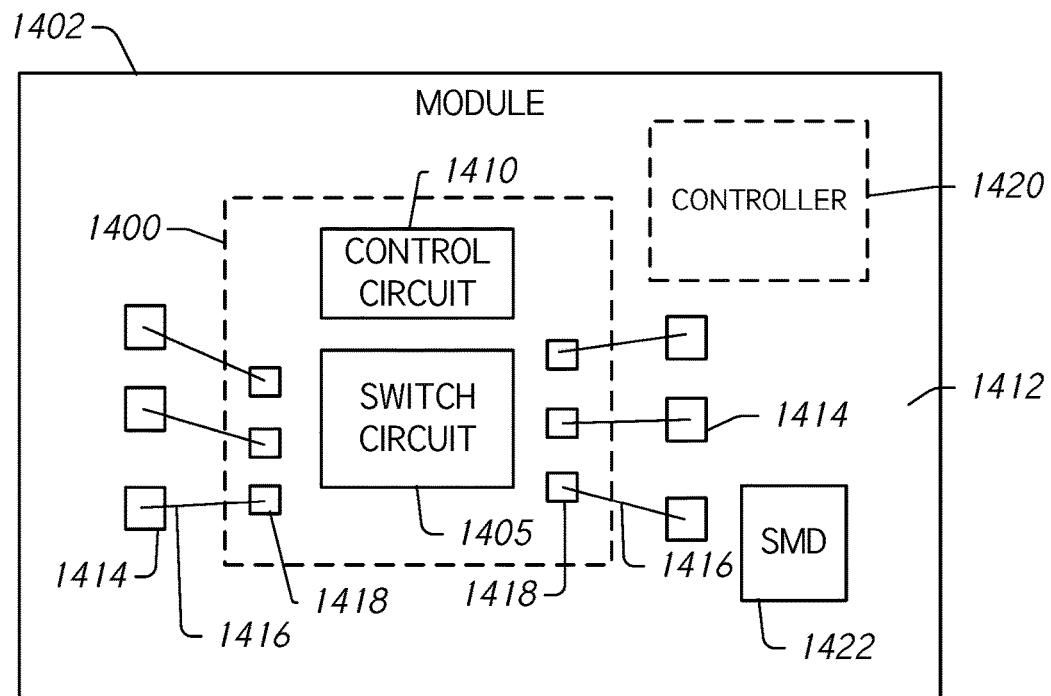
FIGS. 14A and 14B illustrate non-limiting examples of switch circuit implementations as part of a packaged module.

In some embodiments, one or more die having one or more features described herein can be implemented in a packaged module. An example of such a module is illustrated in FIGS. 14A (plan view) and 14B (side view). Although described using a configuration where both the switch circuit and the control circuit are on the same die (e.g., example configuration of FIG. 13A), it will be understood that packaged modules can be based on other configurations.

A module 1402 is shown to include a packaging substrate 1412. Such a packaging substrate can be configured to receive a plurality of components, and can include, for example, a laminate substrate. The components mounted on the packaging substrate 1412 can include one or more dies. In the example shown, a die 1400 having a switching circuit 1405 and a control circuit 1410 is mounted on the packaging substrate 1412. The die 1400 can be electrically connected to other parts of the module (and with each other where more than one die is utilized) through connections such as connection-wirebonds 1416. Such connection-wirebonds can be formed between contact pads 1418 formed on the die 1400 and contact pads 1414 formed on the packaging substrate 1412. In some embodiments, one or more surface mounted devices (SMDs) 1422 can be mounted on the packaging substrate 1412 to facilitate various functionalities of the module 1402.

In some embodiments, the packaging substrate 1412 can include electrical connection paths for interconnecting the various components with each other and/or with contact pads for external connections. For example, a connection path 1432 is depicted as interconnecting the example SMD 1422 and the die 1400. In another example, a connection path 1432 is depicted as interconnecting the SMD 1422 with an external-connection contact pad 1434. In yet another example, a connection path 1432 is depicted as interconnecting the die 1400 with ground-connection contact pads 1436.

In some embodiments, a space above the packaging substrate 1412 and the various components mounted thereon can be filled with an overmold structure 1430. Such an overmold structure can provide a number of desirable functionalities, including protection for the components and wirebonds from external elements, and easier handling of the packaged module 1402.

Figure 14B:
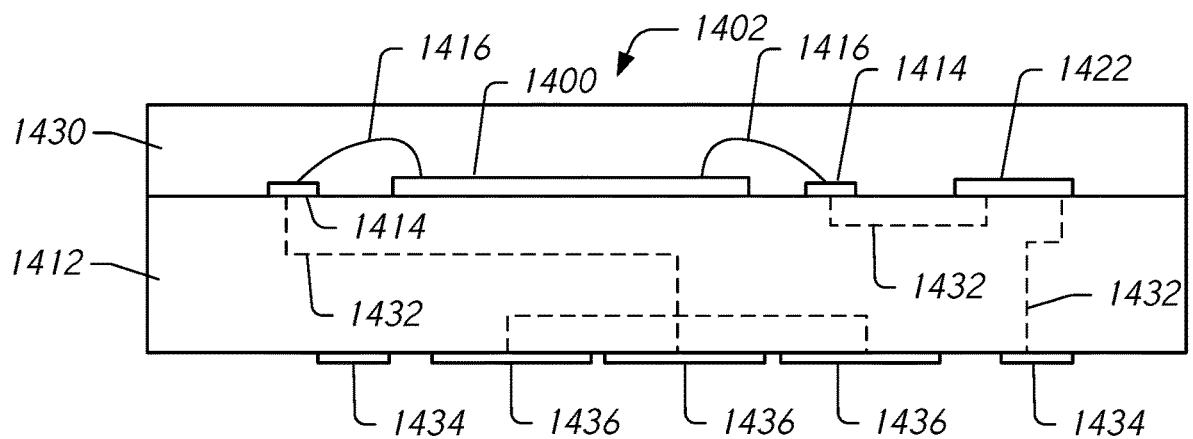
Figure 15:
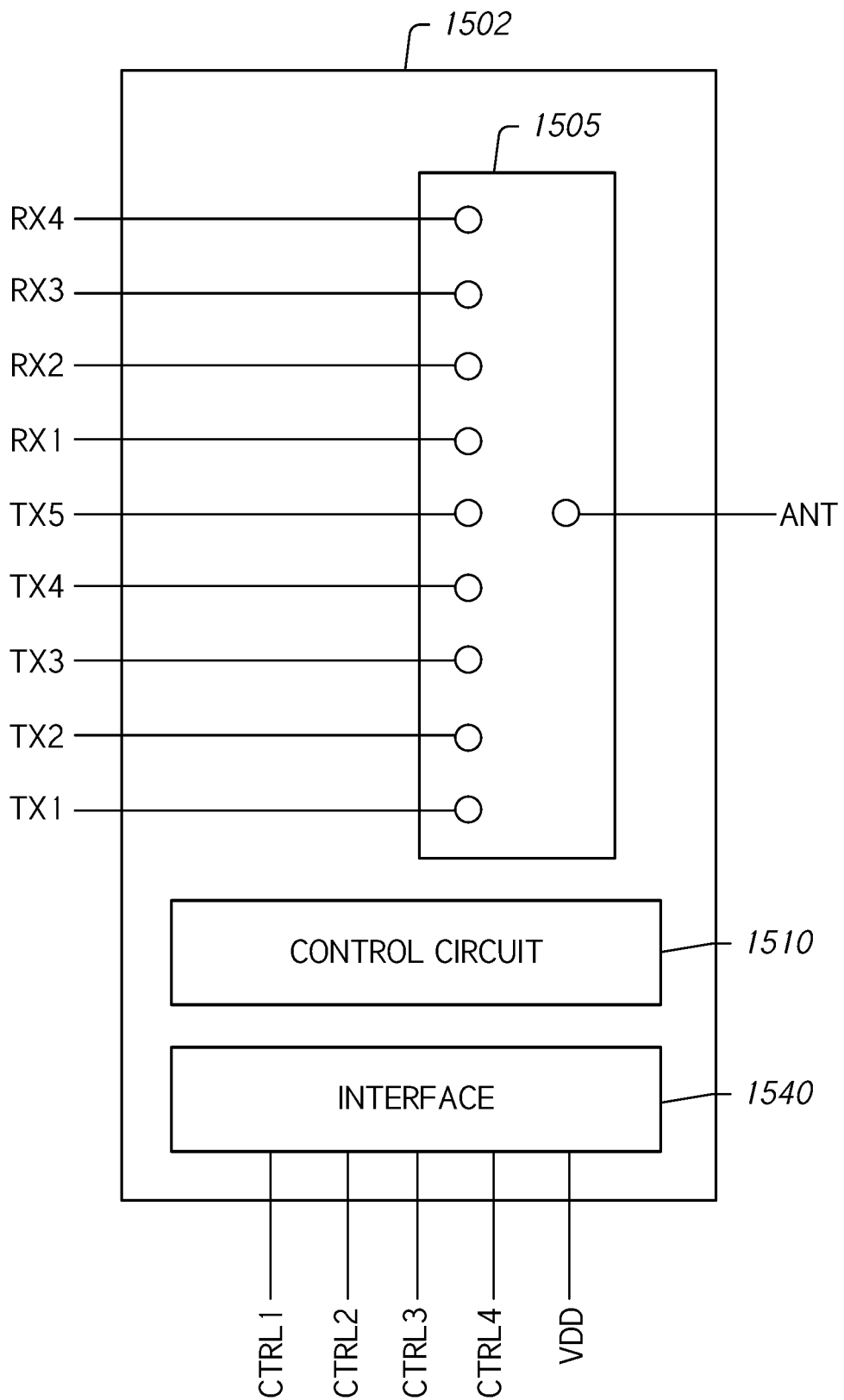
FIG. 15 illustrates a schematic diagram of an example switching configuration that can be implemented in the module described in reference to FIGS. 14A and 14B.

FIG. 15 illustrates a schematic diagram of an example switching configuration that can be implemented in the module 1402 described in reference to FIGS. 14A and 14B. In the example, the switch circuit 1505 is depicted as being an SP9T switch, with the pole being connectable to an antenna and the throws being connectable to various Rx and Tx paths. Such a configuration can facilitate, for example, multi-mode multi-band operations in wireless devices.

The module 1502 can further include an interface for receiving power (e.g., supply voltage VDD) and control signals to facilitate operation of the switch circuit 1505 and/or the control circuit 1510. In some implementations, supply voltage and control signals can be applied to the switch circuit 1505 via the control circuit 1510 through an interface 1540.

Figure 16:
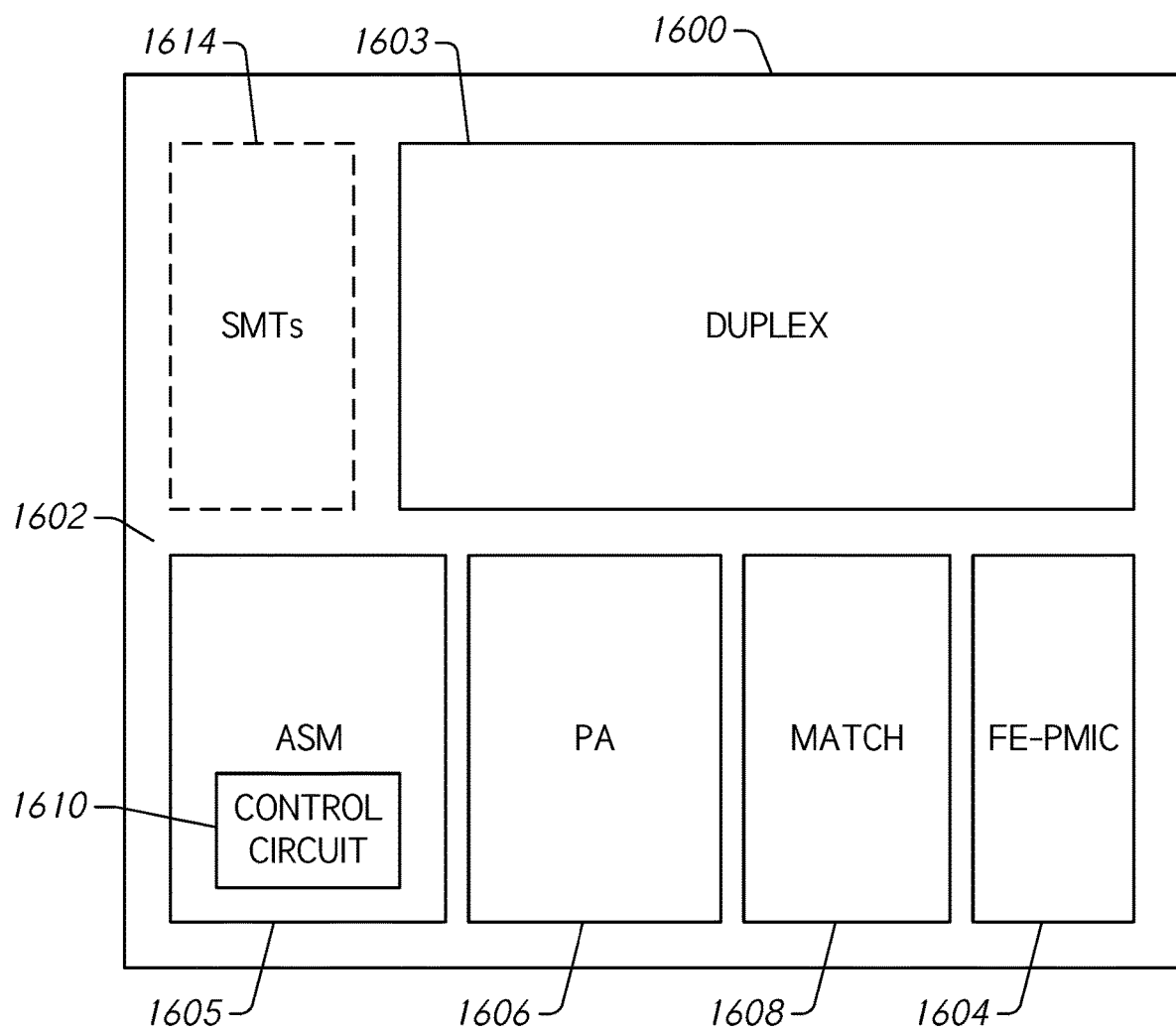
FIG. 16 illustrates that, in some embodiments, some or all of the devices having one or more features as described herein may be implemented in a module.

FIG. 16 illustrates that, in some embodiments, some or all of the devices having one or more features as described herein may be implemented in a module. Such a module may be, for example, a front-end module (FEM). In the example of FIG. 16, a radio frequency (RF) module 1600 can include a packaging substrate 1602, and a number of components may be mounted on such a packaging substrate. For example, a front-end power management integrated circuit (FE-PMIC) component 1604, a power amplifier assembly 1606, a match component 1608, and a duplexer assembly 1603 may be mounted and/or implemented on and/or within the packaging substrate 1602. The FE-PMIC component 1604 includes a supply which may be a power supply (e.g., a battery, a voltage/power source) and/or may be coupled to a power supply. Other components such as a number of surface mount technology (SMT) devices 1614 can also be mounted on the packaging substrate 1602. An antenna switch circuit 1605 can be implemented on the packaging substrate 1602, wherein the antenna switch circuit 1605 includes a control circuit 1610 having one or more level shifters as described herein. Although all of the various components are depicted as being laid out on the packaging substrate 1602, it will be understood that some component(s) may be implemented over other component(s). In some embodiments, the components of the RF module 1600 and one or more serial buses/interfaces (e.g., a RFFE bus/interface) used by the components of the RF module 1600 may implement and/or perform one or more features as described herein.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 17:
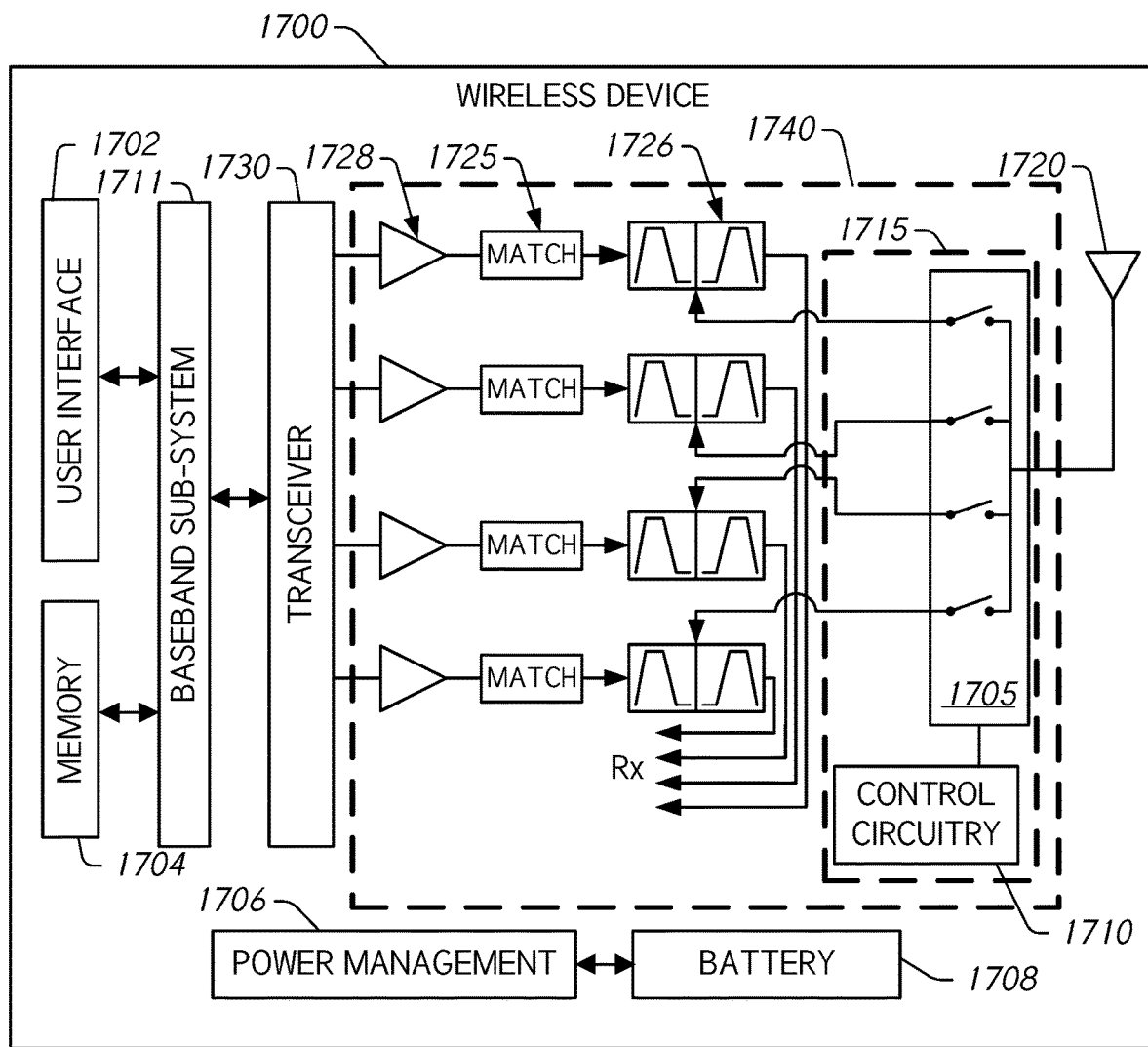
FIG. 17 schematically depicts an example wireless device having one or more advantageous features described herein.

FIG. 17 schematically depicts an example wireless device 1700 having one or more advantageous features described herein. In the context of various switches and various control circuit configurations as described herein, a switch 1705 and a control circuit 1710 can be part of a switch module 1715 integrated into a front-end module 1740. The control circuit 1710 can include one or more level shifters as described herein. In some embodiments, such a switch module 1715 can facilitate, for example, multi-band multi-mode operation of the wireless device 1700.

In the example wireless device 1700, power amplifiers 1728 can provide an amplified RF signal to the switch 1705 via diplexers 1726. The switch 1705 can route the amplified RF signal to an antenna 1720. The PAs 1728 can receive an unamplified RF signal from a transceiver 1730 that can be configured and operated in known manners. The transceiver 1730 can also be configured to process received signals. The transceiver 1730 is shown to interact with a baseband sub-system 1711 that is configured to provide conversion between data and/or voice signals suitable for a user and RF signals suitable for the transceiver 1730. The transceiver 1730 is also shown to be connected to a power management component 1706 that is configured to manage power from a battery 1708 for the operation of the wireless device 1700. Such a power management component can also control operations of the baseband sub-system 1711 and the module 1740.

The baseband sub-system 1711 is shown to be connected to a user interface 1702 to facilitate various input and output of voice and/or data provided to and received from the user. The baseband sub-system 1711 can also be connected to a memory 1704 that is configured to store data and/or instructions to facilitate the operation of the wireless device, and/or to provide storage of information for the user.

In some embodiments, the diplexers 1726 can allow transmit and receive operations to be performed simultaneously using a common antenna (e.g., antenna 1720). Received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

The implementations described herein may be used for various broadband wireless communication systems, including communication systems that are based on an orthogonal multiplexing scheme. Examples of such communication systems include Spatial Division Multiple Access (SDMA), Time Division Multiple Access (TDMA), Orthogonal Frequency Division Multiple Access (OFDMA) systems, Single-Carrier Frequency Division Multiple Access (SC-FDMA) systems, and so forth. An SDMA system may utilize sufficiently different directions to simultaneously transmit data belonging to multiple user terminals. A TDMA system may allow multiple user terminals to share the same frequency channel by dividing the transmission signal into different time slots, each time slot being assigned to different user terminal. A TDMA system may implement GSM (Global System for Mobile Communications) or some other standards known in the art. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An OFDM system may implement IEEE 802.11 or some other standards known in the art. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA. A SC-FDMA system may implement 3GPP-LTE (3rd Generation Partnership Project Long Term Evolution), LTE-Advanced, LTE-Advanced Pro (4.5G) or any other standards and/or ad hoc wireless techniques known in the art.

An access point ("AP") may comprise, be implemented as, or known as NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or known as an access terminal, a subscriber station, a subscriber unit, a mobile station, a remote station, a remote terminal, a user terminal, a user agent, a user device, user equipment, a user station, or some other terminology. In some implementations, an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), a smart phone, a tablet computing device or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), an entertainment device (e.g., a music or video device, or a satellite radio), a global positioning system device, or any other suitable device that is configured to communicate via a wireless or wired medium. In some aspects, the node is a wireless node. Such wireless node may provide, for example, connectivity for or to a network (e.g., a wide area network such as the Internet or a cellular network) via a wired or wireless communication link.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid-state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A voltage level circuit comprising:
a first outer transistor stack including at least six transistors in series between a high voltage input port and a low voltage input port, with at least three series p-channel metal-oxide-semiconductor field effect (PMOS) transistors in series with at least three series n-channel metal-oxide-semiconductor field effect (NMOS) transistors;
a second outer transistor stack coupled in parallel with the first outer transistor stack between the high voltage input port and the low voltage input port, the second outer transistor stack including at least six transistors in series with at least three series PMOS transistors in series with at least three series NMOS transistors;

a first inner transistor stack coupled in parallel with the first outer transistor stack between the high voltage input port and the low voltage input port, the first inner transistor stack including at least four transistors in series with at least two series PMOS transistors in series with at least two series NMOS transistors;

a second inner transistor stack coupled in parallel with the second outer transistor stack between the high voltage input port and the low voltage input port, the second inner transistor stack including at least four transistors in series with at least two series PMOS transistors in series with at least two series NMOS transistors;

at least two inner PMOS transistors that are cross-coupled, a first inner PMOS transistor having its source coupled to a gate of a PMOS transistor of the first inner transistor stack and a second inner PMOS transistor having its source coupled to a gate of a PMOS transistor of the second inner transistor stack;

an input port configured to receive an input signal; and an output port configured to provide an output signal such that in response to receiving a high signal at the input port the output port provides a voltage approximately equal to a voltage provided at the high voltage input port and in response to receiving a low signal at the input port the output port provides a voltage approximately equal to a voltage provided at the low voltage input port.

2. The circuit of claim 1 further comprising a complementary input port configured to receive a complement of the input signal.

3. The circuit of claim 1 wherein the output port is coupled between the three series PMOS transistors and the three series NMOS transistors of the first outer transistor stack.

4. The circuit of claim 1 further comprising a complementary output port configured to provide a second output signal.

5. The circuit of claim 4 wherein in response to receiving a high signal at the input port the complementary output port provides a voltage approximately equal to a voltage provided at the low voltage input port and in response to receiving a low signal at the input port the complementary output port provides a voltage approximately equal to a voltage provided at the high voltage input port.

6. The circuit of claim 4 wherein the complementary output port is coupled between the three series PMOS transistors and the three series NMOS transistors of the second outer transistor stack.

7. The circuit of claim 1 wherein a drain of an NMOS transistor coupled to the low voltage input port of the first inner transistor stack is coupled to a gate of an NMOS transistor coupled to the low voltage input port of the first outer transistor stack.

8. The circuit of claim 7 wherein a drain of an NMOS transistor coupled to the low voltage input port of the second inner transistor stack is coupled to a gate of an NMOS transistor coupled to the low voltage input port of the second outer transistor stack.

9. The circuit of claim 1 further comprising a first bias input configured to receive a first bias signal, a second bias input configured to receive a second bias signal, and a third bias input configured to receive a third bias signal.

10. The circuit of claim 9 wherein, in the first outer transistor stack, a gate of a first PMOS transistor that has its source coupled to the high voltage input port receives a complement of the input signal, a gate of a second PMOS transistor that has its source coupled to a drain of the first PMOS transistor receives the first bias signal, a gate of a third PMOS transistor that has its source coupled to a drain of the second PMOS transistor receives the second bias signal, a gate of a first NMOS transistor that has its drain coupled to a drain of the third PMOS transistor receives the second bias signal, and a gate of a second NMOS transistor that has its drain coupled to a source of the first NMOS transistor receives the third bias signal.

11. The circuit of claim 10 wherein, in the first inner transistor stack, a gate of a first PMOS transistor that has its source coupled to the high voltage input port receives the input signal, a gate of a second PMOS transistor that has its source coupled to a drain of the first PMOS transistor receives the first bias signal, a gate of a first NMOS transistor that has its drain coupled to a drain of the second PMOS transistor receives the second bias signal.

12. The circuit of claim 1 further comprising one or more diodes coupled between two of the NMOS series transistors of the first inner transistor stack.

13. A switch control circuit comprising one or more of the circuits of claim 1 wherein the switch control circuit is configured to generate a negative voltage of at least −4 V.

14. A radio-frequency (RF) module comprising:
a packaging substrate configured to receive a plurality of components; and
a switching circuit implemented on the packaging substrate, the switching circuit including a voltage level shifter having first outer transistor stack including at least six transistors in series between a high voltage input port and a low voltage input port, with at least three series p-channel metal-oxide-semiconductor field effect (PMOS) transistors in series with at least three series n-channel metal-oxide-semiconductor field effect (NMOS) transistors, the switching circuit further including a second outer transistor stack coupled in parallel with the first outer transistor stack between the high voltage input port and the low voltage input port, the second outer transistor stack including at least six transistors in series with at least three series PMOS transistors in series with at least three series NMOS transistors, the voltage level shifter further including a first inner transistor stack coupled in parallel with the first outer transistor stack between the high voltage input port and the low voltage input port, the first inner transistor stack including at least four transistors in series with at least two series PMOS transistors in series with at least two series NMOS transistors, the voltage level shifter further including a second inner transistor stack coupled in parallel with the second outer transistor stack between the high voltage input port and the low voltage input port, the second inner transistor stack including at least four transistors in series with at least two series PMOS transistors in series with at least two series NMOS transistors, the voltage level shifter further including at least two inner PMOS transistors that are cross-coupled, a first inner PMOS transistor having its source coupled to a gate of a PMOS transistor of the first inner transistor stack and a second inner PMOS transistor having its source coupled to a gate of a PMOS transistor of the second inner transistor stack, the voltage level shifter further including an input port configured to receive an input signal, the voltage level shifter further including an output port configured to provide an output signal such that in response to receiving a high signal at the input port the output port provides a voltage approximately equal to a voltage provided at the high voltage input port and in response to receiving a low signal at the input port the output port provides a voltage approximately equal to a voltage provided at the low voltage input port.

15. The RF module of claim 14 wherein the RF module is a front-end module.

16. The RF module of claim 14 wherein the switching circuit further comprises a voltage generator to output a positive voltage provided to the high voltage input port and a negative voltage provided to the low voltage input port.

17. The RF module of claim 16 wherein the switching circuit further includes a series arm configured to receive an RF signal and to output the RF signal in an on state, the series arm configured to receive the positive voltage through the voltage level shifter to put the series arm in the on state and to receive the negative voltage through the voltage level shifter to put the series arm in an off state.

18. The RF module of claim 17 wherein the switching circuit is implemented on a single semiconductor die.

19. A wireless device comprising:
   a transceiver configured to generate a radio-frequency (RF) signal;
   a front-end module (FEM) in communication with the transceiver, the FEM including a packaging substrate configured to receive a plurality of components, the FEM further including a switching circuit implemented on the packaging substrate, the switching circuit including a voltage level shifter having first outer transistor stack including at least six transistors in series between a high voltage input port and a low voltage input port, with at least three series p-channel metal-oxide-semiconductor field effect (PMOS) transistors in series with at least three series n-channel metal-oxide-semiconductor field effect (NMOS) transistors, the switching circuit further including a second outer transistor stack coupled in parallel with the first outer transistor stack between the high voltage input port and the low voltage input port, the second outer transistor stack including at least six transistors in series with at least three series PMOS transistors in series with at least three series NMOS transistors, the voltage level shifter further including a first inner transistor stack coupled in parallel with the first outer transistor stack between the high voltage input port and the low voltage input port, the first inner transistor stack including at least four transistors in series with at least two series PMOS transistors in series with at least two series NMOS transistors, the voltage level shifter further including a second inner transistor stack coupled in parallel with the second outer transistor stack between the high voltage input port and the low voltage input port, the second inner transistor stack including at least four transistors in series with at least two series PMOS transistors in series with at least two series NMOS transistors, the voltage level shifter further including at least two inner PMOS transistors that are cross-coupled, a first inner PMOS transistor having its source coupled to a gate of a PMOS transistor of the first inner transistor stack and a second inner PMOS transistor having its source coupled to a gate of a PMOS transistor of the second inner transistor stack, the voltage level shifter further including an input port configured to receive an input signal, the voltage level shifter further including an output port configured to provide an output signal such that in response to receiving a high signal at the input port the output port provides a voltage approximately equal to a voltage provided at the high voltage input port and in response to receiving a low signal at the input port the output port provides a voltage approximately equal to a voltage provided at the low voltage input port; and
   an antenna in communication with the FEM, the antenna configured to transmit the amplified RF signal.

20. The wireless device of claim 19 wherein the switching circuit comprises a dual pole dual throw switch configured to swap the RF signal between the antenna and a diversity antenna.

* * * * *